(12) United States Patent
Hayashi et al.

(10) Patent No.: US 7,138,668 B2
(45) Date of Patent: Nov. 21, 2006

(54) HETEROJUNCTION DIODE WITH REDUCED LEAKAGE CURRENT

(75) Inventors: Tetsuya Hayashi, Yokosuka (JP); Hideaki Tanaka, Yokosuka (JP); Masakatsu Hoshi, Yokohama (JP); Saichirou Kaneko, Mukou (JP)

(73) Assignee: Nissan Motor Co., Ltd., Kanagawa-Ken (JP)

( * ) Notice: Subject to any disclaimer, the term of this patent is extended or adjusted under 35 U.S.C. 154(b) by 18 days.

(21) Appl. No.: 10/898,224

(22) Filed: Jul. 26, 2004

(65) Prior Publication Data
US 2005/0045892 A1    Mar. 3, 2005

(30) Foreign Application Priority Data
Jul. 30, 2003  (JP)  ............ P 2003-282476
Mar. 9, 2004  (JP)  ............ P 2004-065972
Apr. 13, 2004  (JP)  ............ P 2004-117549

(51) Int. Cl.
*A01L 31/072*  (2006.01)

(52) U.S. Cl. .............. 257/183; 257/197; 257/76; 257/65; 257/55

(58) Field of Classification Search .......... None
See application file for complete search history.

(56) References Cited

U.S. PATENT DOCUMENTS

| 6,175,143 | B1 | 1/2001 | Fujihira et al. |
| 6,246,077 | B1 | 6/2001 | Kobayashi et al. |
| 2002/0197809 | A1 | 12/2002 | Asai et al. |
| 2003/0052321 | A1 | 3/2003 | Sridevan |
| 2004/0031971 | A1* | 2/2004 | Shimoida et al. ........ 257/199 |
| 2004/0079989 | A1* | 4/2004 | Kaneko et al. .......... 257/328 |

FOREIGN PATENT DOCUMENTS

| EP | 0 794 578 A1 | 9/1997 |
| JP | 2003-318413 | 11/2003 |

OTHER PUBLICATIONS

"Power Device/Power IC Handbook" Japanese Electrotechnical Committee, pp. 12-21.

Shenoy, P.M., et al. "High Voltage P⁺polysilicon/N⁻6H-SiC heterojunction diodes." Electronics Letters, IEE Stevenage, GB, vol. 33, No. 12, Jun. 5, 1997, pp. 1086-1087.

* cited by examiner

*Primary Examiner*—Nathan J. Flynn
*Assistant Examiner*—Scott R. Wilson
(74) *Attorney, Agent, or Firm*—McDermott Will & Emery LLP

(57) ABSTRACT

An aspect of the present invention provides a semiconductor device that includes a first semiconductor region of a first conductivity type and a second semiconductor region of a second conductivity type, having a different band gap from the first semiconductor region and forming a heterojunction with the first semiconductor region.

22 Claims, 21 Drawing Sheets

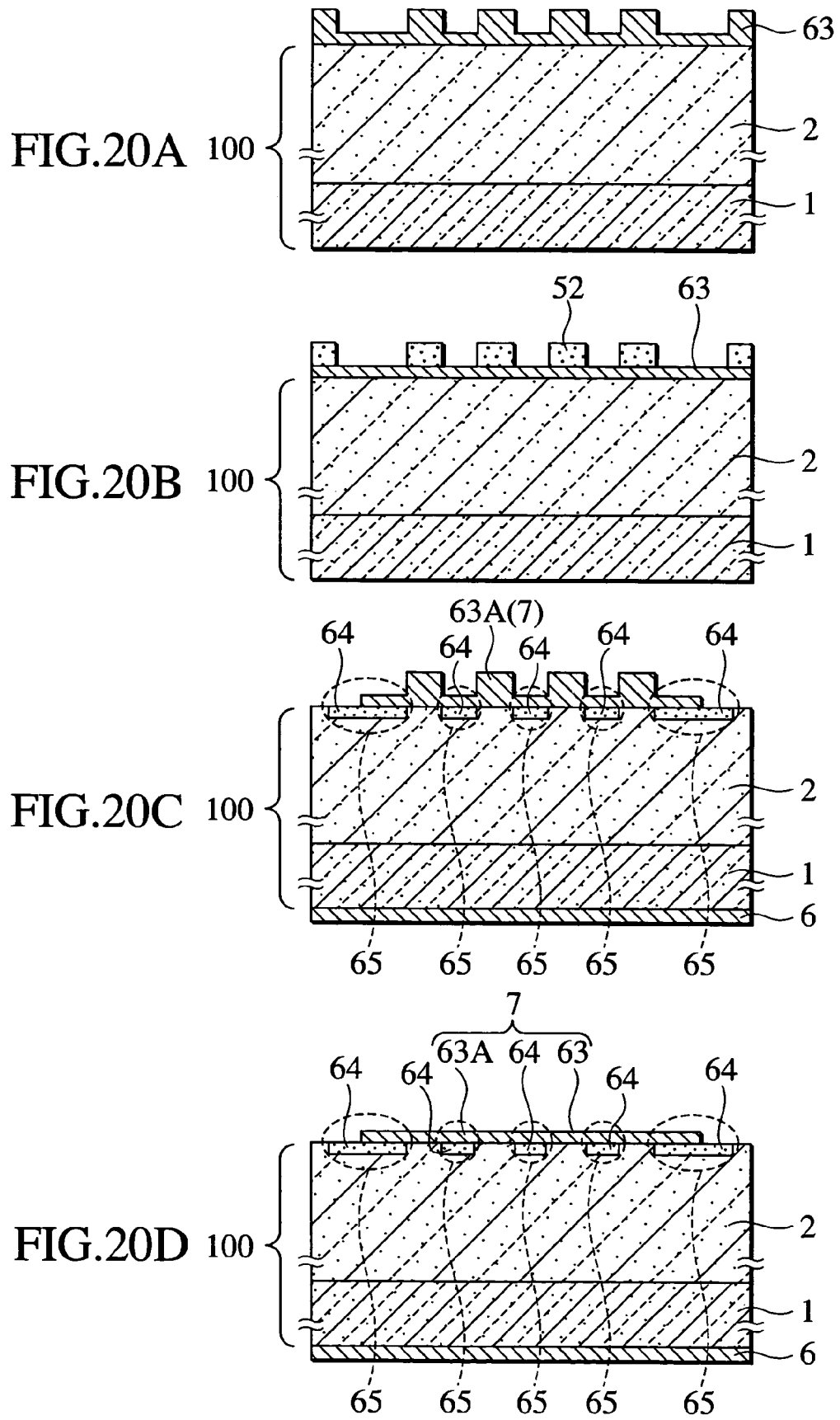

HETEROJUNCTION DIODE WITH REDUCED LEAKAGE CURRENT

BACKGROUND OF THE INVENTION

The present invention relates to a semiconductor device and a method of manufacturing the same, and particularly, to a semiconductor device having a heterojunction and a method of manufacturing the same.

Japanese Laid-Open Patent Publication No. 2003-318413 discloses a semiconductor device having a semiconductor base made of an n$^+$-type silicon carbide substrate region and an n$^-$-type epitaxial region formed on the substrate region. On one principal face of the semiconductor base, an n-type polysilicon region is formed. The epitaxial region and n-type polysilicon region form a heterojunction. In contact with an end of the heterojunction, a p-type electric field relaxation region is formed. On a bottom face of the n$^+$-type silicon carbide substrate region, a bottom electrode is formed. On the surface of the polysilicon region, a surface electrode is formed.

On the other hand, a Schottky junction is a junction that uses conventional silicon carbide to provide a diode having a high withstand voltage as described in "Power Device/Power IC Handbook," Japanese Electrotechnical Committee, High-Performance, High-Function Power Device/Power IC Research Expert Committee, Corona Publishing Co., Ltd., p.p. 12–21 (nonpatent literature). The junction described in this nonpatent literature is based on silicon and is widely applied to silicon carbide.

SUMMARY OF THE INVENTION

The related art mentioned first simply forms a heterojunction with the use of polysilicon, and therefore, a reverse leakage current characteristic thereof resembles that of the Schottky junction. Namely, it is difficult for the related art to achieve a high disconnection performance and a high temperature characteristic superior to those of the Schottky junction.

The related art may reduce an impurity concentration in the electric field relaxation region, to increase a withstand voltage between the epitaxial region and the electric field relaxation region. This, however, expands a depletion layer into the whole of the electric field relaxation region, to expose an end of the heterojunction to an electric field spread in the epitaxial region. This results in increasing a leakage current at the end of the heterojunction. Namely, according to the related art, the effect of increasing the withstand voltage of the epitaxial region with the use of the electric field relaxation region conflicts with the effect of preventing a leakage current occurring at an end of the polysilicon region.

On the other hand, the technique of applying a Schottky junction to silicon carbide to realize a diode having a high withstand voltage must form a diffusion layer serving as an electric field relaxation region at an end of a Schottky electrode, to relax an electric field concentration at the end of the Schottky electrode. To form the diffusion layer, an ion implantation technique is used. When applied to silicon carbide, the ion implantation needs an activation heat treatment that must be carried out at a high temperature of 1500° C. or over. Such a high-temperature heat treatment deteriorates the surface of the silicon carbide substrate. On the surface of such a deteriorated silicon carbide substrate, it is impossible to form a good Schottky junction that can provide a diode having a high withstand voltage.

An aspect of the present invention provides a semiconductor device that includes a first semiconductor region of a first conductivity type and a second semiconductor region of a second conductivity type, having a different band gap from the first semiconductor region and forming a heterojunction with the first semiconductor region.

Another aspect of the present invention provides a method of manufacturing a semiconductor device that includes forming a first semiconductor region from a first semiconductor material, forming a second semiconductor region on a surface of the first semiconductor region from a second semiconductor material whose band gap is different from that of the first semiconductor material, thereby forming a heterojunction between the first semiconductor region and the second semiconductor region, and introducing impurities into a surface of the second semiconductor region, to form an impurity introduced region in the first semiconductor region that forms the heterojunction with the second semiconductor region.

BRIEF DESCRIPTION OF THE DRAWINGS

FIGS. 20A, 20B, 20C, and 20D are section views for illustrating another method of manufacturing a semiconductor device according to the fourth embodiment of the present invention.

DETAILED DESCRIPTION OF EMBODIMENTS

Figure 1:
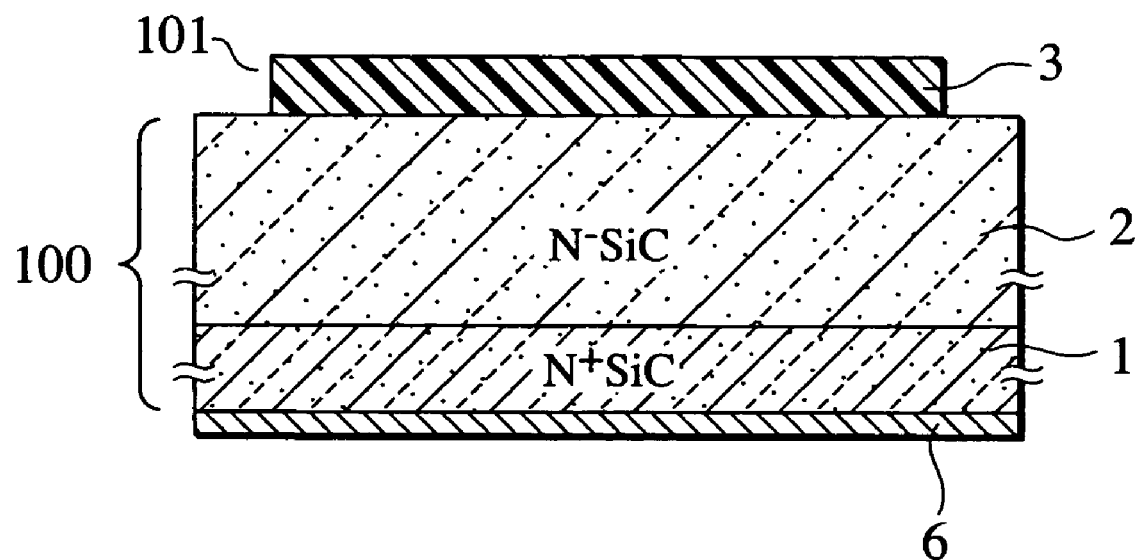
FIG. 1 is a sectional view showing a semiconductor device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

FIG. 1 is a sectional view showing a semiconductor device according to a first embodiment of the present invention. According to this embodiment, the semiconductor device employs a silicon carbide substrate 1. The silicon carbide substrate 1 is made of an $n^+$-type and is made of, for example, silicon carbide of polytype 4H. On the substrate 1, an $n^-$-type epitaxial region 2 is formed to provide a silicon carbide semiconductor base 100. The substrate 1 has, for example, a specific resistance of several mΩ (milliohm(s)) cm to several tens of Ω (ohm) cm and a thickness of about 200 to 400 µm (micro meter(s)). The epitaxial region 2 has, for example, an n-type impurity concentration of $10^{15}$ to $10^{18}$ cm$^{-3}$ and a thickness of several µm (micro meter(s)) to several tens of µm (micro meter(s)). According to this embodiment, the epitaxial region 2 has an impurity concentration of $10^{16}$ cm$^{-3}$ and a thickness of 10 µm (micro meter(s)). Although the first embodiment is explained in connection with the silicon carbide semiconductor base 100 made of the silicon carbide substrate 1 and the epitaxial region 2 formed thereon, a semiconductor base made of only the silicon carbide substrate 1 having an optional specific resistance is also employable.

On a principal face (an upper face in FIG. 1) of the epitaxial region 2 opposite to a junction face between the epitaxial region 2 and the silicon carbide substrate 1, there is deposited a first polysilicon region (polysilicon region) 3 (polysilicon layer 101) serving as a second semiconductor region and having a smaller band gap than silicon carbide. The first polysilicon region 3 contains impurities. In this embodiment, the first polysilicon region 3 is doped with high-concentration p-type impurities. According to this embodiment, the first polysilicon region 3 has, for example, an impurity concentration of $10^{18}$ cm$^{-3}$ and a thickness of 0.5 µm (micro meter(s)).

Figure 11:
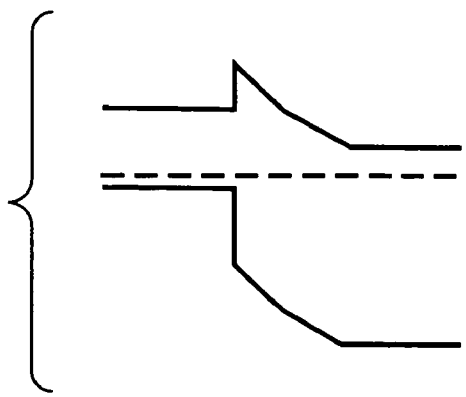
FIG. 11 is an energy band diagram of a hetero junction according to the first embodiment.

A junction between the epitaxial region 2 and the first polysilicon region 3 is a heterojunction between silicon carbide and polysilicon having different band gaps. An interface at the junction involves an energy barrier shown in an energy band diagram of FIG. 11. According to the first embodiment, a bottom face of the silicon carbide substrate 1 is provided with a bottom metal electrode 6. The bottom metal electrode 6 forms an ohmic contact with the silicon carbide substrate 1. The bottom metal electrode 6 is made of, for example, Ti (titanium) of 5000 angstroms thick and Ni (nickel) of 3000 angstroms thick deposited over the Ti.

Figure 2:
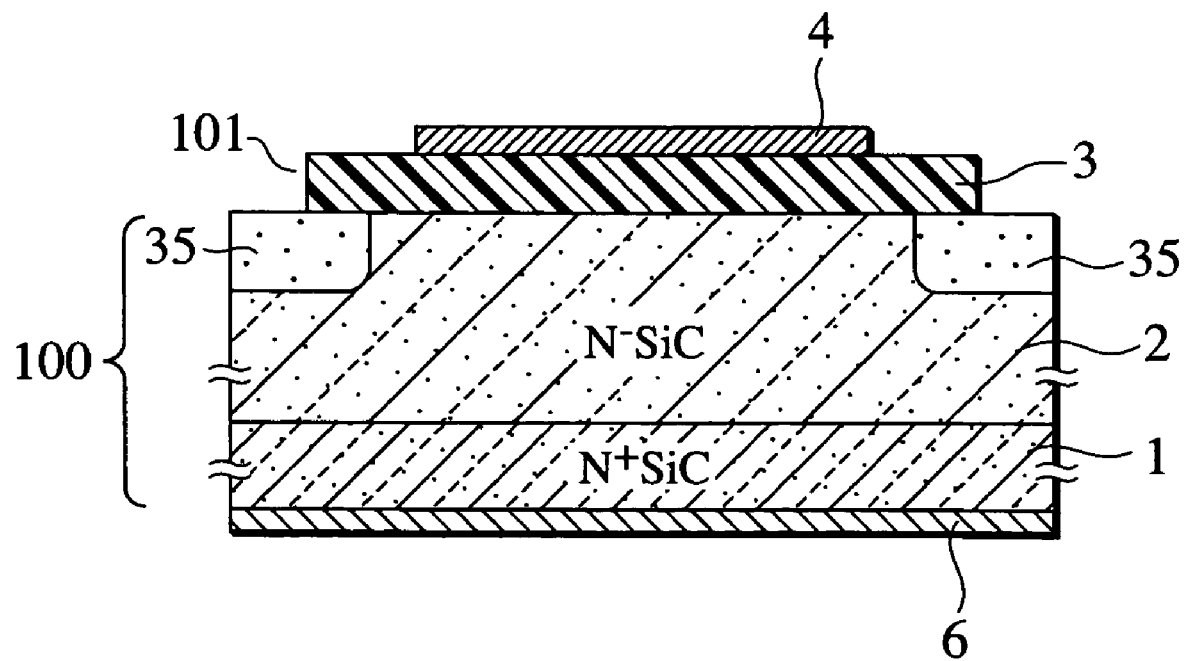
FIG. 2 is a sectional view showing another semiconductor device according to the first embodiment of the present invention.

According to the first embodiment, the polysilicon layer 101 serves as an anode and the bottom metal electrode 6 as a cathode to form a vertical diode. For the sake of easy understanding, the first embodiment employs a simple structure with the polysilicon layer 101 serving as an anode. It is also acceptable to form an electric field relaxation region 35 as shown in FIG. 2, to prevent an electric field concentration at an end of the polysilicon layer 101. It is also possible to form a surface metal electrode 4 on the surface of the polysilicon layer 101 as shown in FIG. 2.

Operation of the first embodiment will be explained. A voltage is applied between the bottom metal electrode 6 serving as a cathode and the first polysilicon region 3 serving as an anode. This causes a rectifying action at the junction interface between the first polysilicon region 3 and the silicon carbide epitaxial region 2, to provide a diode characteristic.

Figure 12:
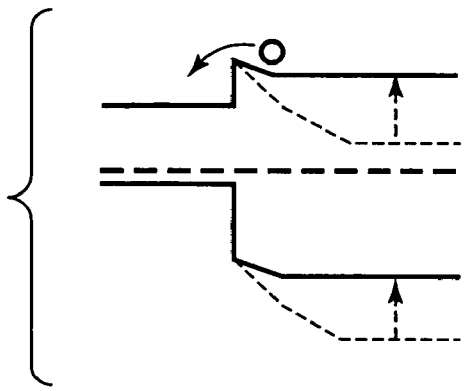
FIG. 12 is an energy band diagram of the hetero junction applied a negative potential to the cathode positive voltage (positive bias) according to the first embodiment.

Firstly, the anode is grounded and a negative potential is applied to the cathode. Then, an energy band at the heterojunction interface changes from a dotted line to a solid line in FIG. 12. As shown in FIG. 12, electrons supplied from the cathode flow to the anode because an energy barrier formed at the heterojunction interface decreases. On the other hand, holes supplied from the anode do not flow to the cathode because the energy barrier formed at the heterojunction interface remains. On the anode side, the electrons supplied from the cathode and the holes supplied from the anode cause recombination, to pass a forward current. This forward characteristic according to the first embodiment is caused by holes serving as a main current component of the anode and electrons serving as a main current component of the cathode. This characteristic is different from that of a Schottky diode. In appearance, however, the first embodiment operates like a majority carrier device in which no holes are injected into the cathode. This operation resembles that of a conventional structure or a Schottky junction diode. Namely, the forward characteristic can pass a current due to a voltage drop that is determined by the sum of a built-in potential from the heterojunction to the epitaxial region 2 and a built-in potential from the heterojunction to the first polysilicon region 3. According to the first embodiment, the sum of such built-in potentials is about 1.3 V, and a voltage drop corresponding to the sum passes a forward current.

Figure 7:
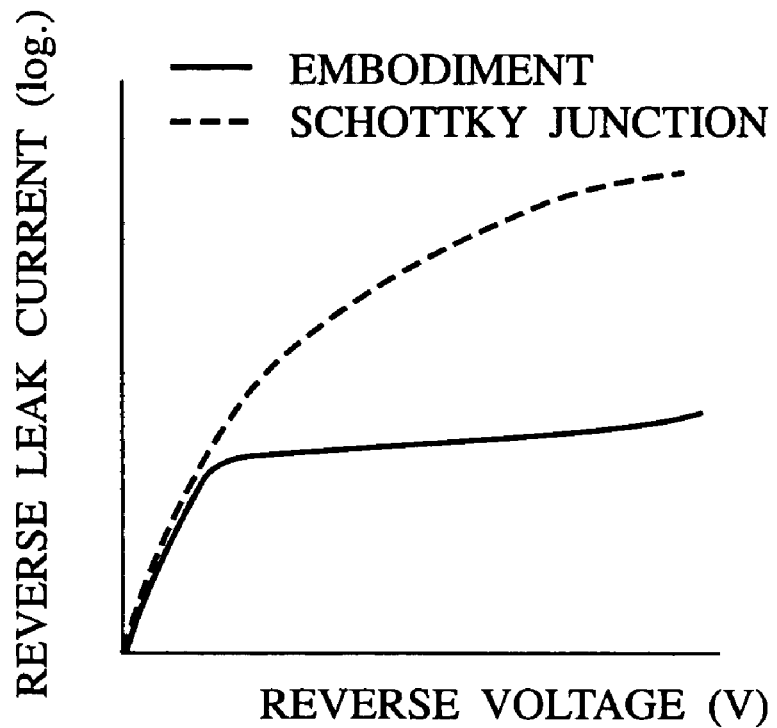
FIG. 7 is a plot of the reverse leak current (logarithm) versus reverse voltage to contrast the embodiment with a conventional schottky junction.
Figure 13:
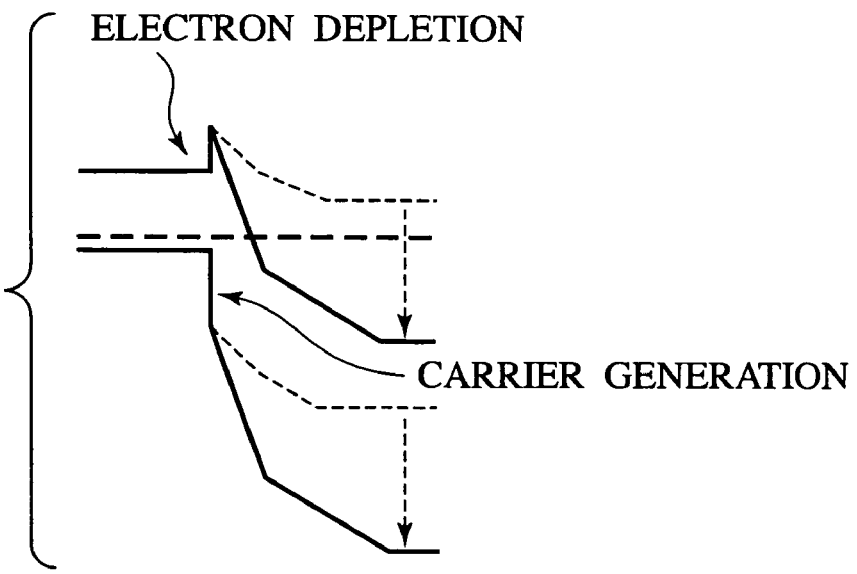
FIG. 13 is an energy band diagram of the hetero junction applied a positive potential to the cathode positive voltage (negative bias) according to the first embodiment.

Next, the anode is grounded and a positive potential is applied to the cathode. Then, the energy band at the heterojunction interface changes from a thermal equilibrium state indicated with a dotted line to a solid line shown in FIG. 13, to establish a reversely biased state. As shown in FIG. 13, the heterojunction interface on the anode side involves the first polysilicon region 3 containing p-type impurities at high concentration, to form an electron depleted state. As a result, an electron current hardly flows through an energy barrier formed at the heterojunction interface. On the other hand, the heterojunction interface on the cathode side involves the epitaxial region 2 made of n-type silicon carbide having a wide gap, to form a hole depleted state. As a result, a positive hole current hardly flows to the anode side. In this way, a reverse characteristic of the fist embodiment operates like a pn junction diode as shown in FIG. 7.

This is greatly different from the related art that shows a leakage current characteristic like a Schottky junction diode. As will be explained later, the first embodiment can greatly reduce a leakage current flowing through a heterobarrier formed at the heterojunction interface to look like a pn junction diode due to carriers generated under a given electric field. The present inventors are the first to find this operating mechanism of the heterojunction and clarify the mechanism from numerical calculations.

The reverse characteristic will be explained in detail. The reverse characteristic of a Schottky junction diode is substantially uniquely determined by the height of a Schottky barrier formed according to a difference between an electron affinity of semiconductor material and a work function of Schottky metal. However, the reverse characteristic of a heterojunction diode having a conventional structure or the structure of the first embodiment is determined by three major factors explained below.

The first factor is a reverse blocking ability against majority carriers (electrons in this embodiment). Like the case of the Schottky junction, the reverse blocking ability of the heterojunction diode is determined by the height of a heterobarrier formed according to a difference between the electron affinities of semiconductor materials.

The second factor is a leakage current supplying ability determined by a majority carrier generating source that generates a leakage current The third factor is a withstanding voltage securing ability to distribute a voltage applied to the heterojunction diode to the semiconductor materials thereof according to the dielectric constants and impurity concentrations of the semiconductor materials. The first embodiment of the present invention is characterized by the second and third factors that correlate with each other.

The first factor, i.e., the reverse blocking ability of the first embodiment is substantially determined by the semiconductor materials of the silicon carbide epitaxial region 2 and first polysilicon region 3, and therefore, is equivalent to that of the related art The second factor, i.e., the leakage current supplying ability of the first embodiment is quite smaller than that of the related art. Namely, the first embodiment is configured to suppress the generation of conduction electrons in the first polysilicon region 3, the conduction electrons being majority carriers for the n-type epitaxial region 2. More precisely, the first embodiment forms the first polysilicon region 3 as p-type and sets the impurity concentration and thickness of part of the first polysilicon region 3 such that the part of the first polysilicon region 3 is not depleted. That is to say, the first polysilicon region 3 has at least a non-depletion area that is not depleted.

Forming the first polysilicon region 3 as p-type contributes not to make the first polysilicon region 3 act as a supply source of conduction electrons. Preventing part of the first polysilicon region 3 from being depleted contributes to prevent the first polysilicon region 3 from being entirely depleted and stop the supply of conductive electrons from the surface metal electrode 4 (FIG. 2). Namely, partly preventing the first polysilicon region 3 from being depleted contributes to cut the conductive electron supply source on the anode side. If the thickness of an area not depleted of the first polysilicon region 3 is greater than an electron diffusion length of the first polysilicon region 3, the electron supply source cutting effect improves.

In connection with the third factor, i.e., the withstanding voltage securing ability, the first embodiment is effective to suppress carriers to be generated under a predetermined electric field on the smaller-band-gap semiconductor material side (the first polysilicon region 3 side in the first embodiment). For example, the first polysilicon region 3 is structured to hardly cause an avalanche breakdown. A potential distribution ratio of the semiconductor regions that form the heterojunction greatly affects the withstanding voltage securing ability and is substantially determined by the dielectric constants and impurity concentrations of the semiconductor materials. For example, if the semiconductor materials have substantially the same dielectric constant and the same impurity concentration, a potential is substantially equally distributed to the semiconductor regions. Namely, to utilize the characteristic of the epitaxial region 2 having a large band gap and generates a small amount of carriers under a predetermined electric field, the epitaxial region 2 must hold at least a half of a potential difference applied between the cathode and the anode. Namely, it is effective to make the impurity concentration of the first polysilicon region 3 equal to or higher than that of the epitaxial region 2.

The withstanding voltage securing ability of the epitaxial region 2 may further be improved by distributing a potential to the epitaxial region 2 in excess of a critical field strength ratio of the semiconductor materials. For this, the first embodiment provides, for example, the epitaxial region 2 with an impurity concentration of $10^{16}$ cm$^{-3}$ and a thickness of 10 μm (micro meter(s)) and the polysilicon region 3 with an impurity concentration of $10^{18}$ cm$^{-3}$ and a thickness of 0.5 μm (micro meter(s)). Numerical calculations based on these conditions and a voltage of 1000 V applied between the cathode and the anode of the first embodiment show a potential difference in the first polysilicon region 3 of only 10 V or below and an electric field extension of only about 0.2 μm (micro meter(s)). This means that a voltage of 990 V is held by the epitaxial region 2. According to the first embodiment, the impurity concentration of the first polysilicon region 3 is, for example, $10^{18}$ cm$^{-3}$. As the impurity concentration of the first polysilicon region 3 increases, the three factors mentioned above improve to realize a higher disconnecting ability. Namely, to increase the disconnecting ability, the first polysilicon region 3 must have a high impurity concentration.

In this way, the leakage current characteristic dramatically improves by making the epitaxial region 2 secure a withstanding voltage like a Schottky junction diode and by suppressing the generation of conductive electrons on the first polysilicon region 3 side. According to numerical calculations based on the first embodiment, there is provided a pn-junction-like reverse characteristic as shown in FIG. 7 in which carriers generated in a predetermined electric field determine a leakage current. Accordingly, the first embodiment is capable of suppressing a leakage current at the normal temperature, and therefore, is capable of operating at higher temperatures.

As explained above, the first embodiment limits the first polysilicon region 3 to p-type if the epitaxial region 2 is of n-type and makes part of the first polysilicon region 3 not depleted, to reduce a leakage current. To utilize the characteristic of the epitaxial region 2 of generating a relatively small quantity of leakage current, the first embodiment makes the impurity concentration of the first polysilicon region 3 equal to or greater than that of the epitaxial region 2. Further, to improve the withstanding voltage securing ability of the epitaxial region 2, the first embodiment distributes a potential to the epitaxial region 2 in excess of a critical field strength ratio between the epitaxial region 2 and the first polysilicon region 3. In addition, the first embodiment makes the thickness of the not-depleted part of the first polysilicon region 3 greater than an electron diffusion length in the first polysilicon region 3.

When a reverse bias is applied between the anode and the cathode of the heterojunction diode according to the first embodiment that ensures the above-mentioned conditions, the supply of electrons from the first polysilicon region 3 dramatically decreases to greatly reduce a leakage current. This is because the structure of the first embodiment realizes at least the pn-junction-like reverse leakage current characteristic in which a leakage current is mainly caused by carriers generated under a predetermined electric field.

Namely, an apparent forward characteristic of the first embodiment is equivalent to that of a Schottky diode while the reverse characteristic thereof shows the leakage current mechanism of a pn junction. As a result, the first embodiment causes a smaller leakage current than the Schottky diode.

Figure 3:
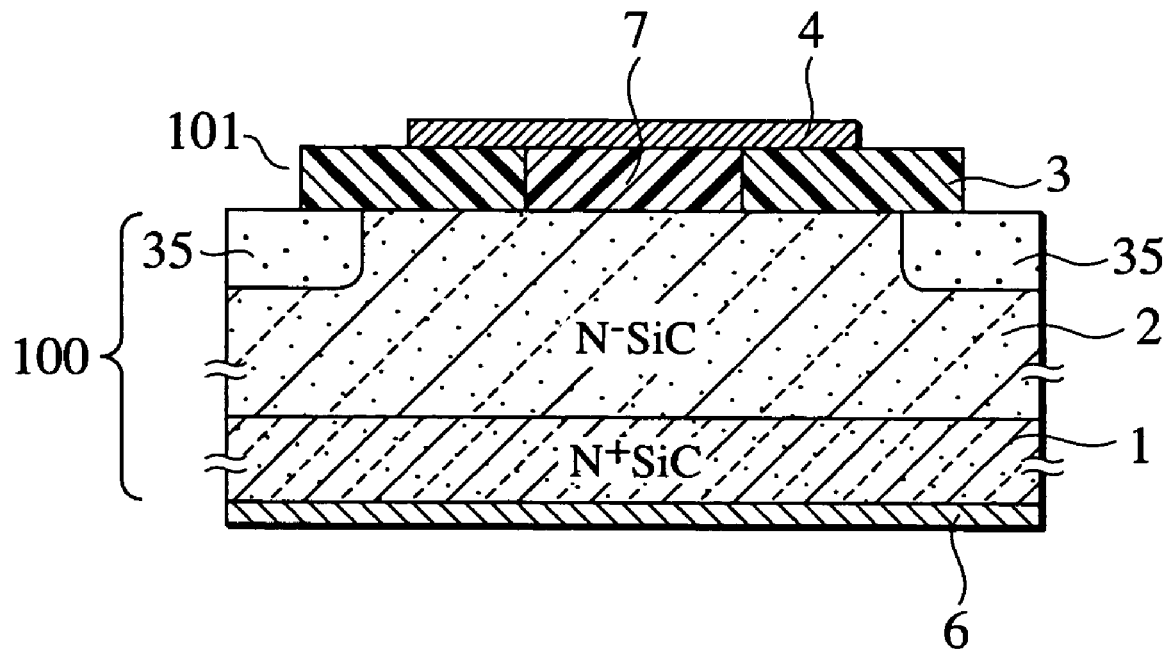
FIG. 3 is a sectional view showing still another semiconductor device according to the first embodiment of the present invention.
Figure 8:
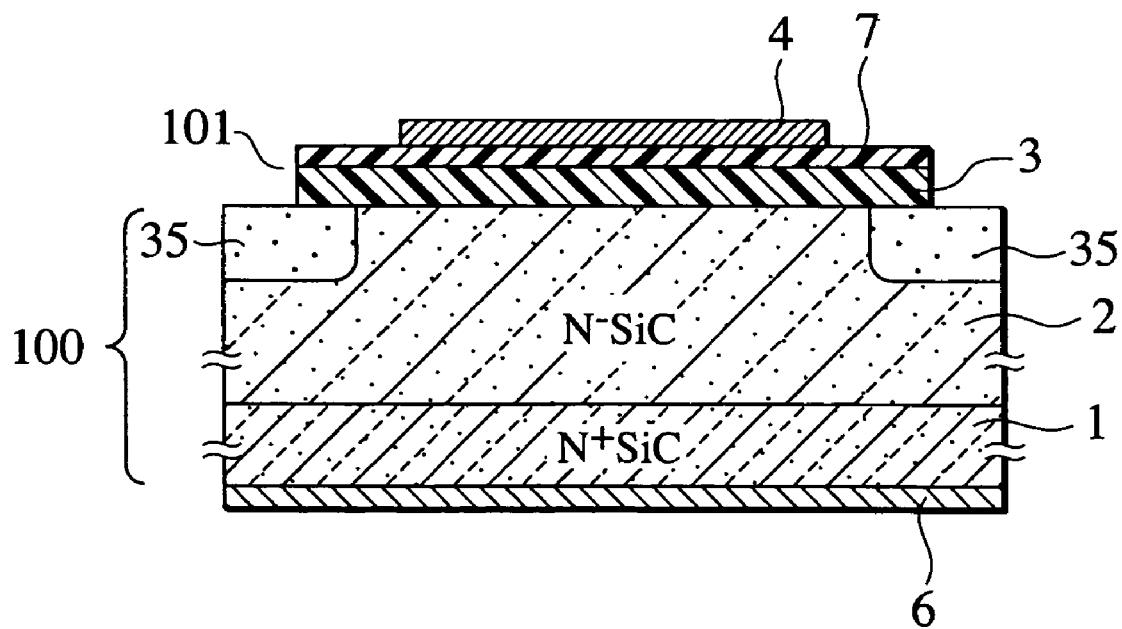
FIG. 8 is still another sectional view showing a semiconductor device according to the first embodiment of the present invention.

In FIGS. 1 and 2, the polysilicon layer 101 is made of the first polysilicon region 3 having a single conductivity type and a single impurity concentration. Instead, the polysilicon layer 101 may have a second polysilicon region 7 having a different conductivity type or a different impurity concentration from the first polysilicon region 3, as shown in FIGS. 3 and 8. In this case, the first polysilicon region 3 and second polysilicon region 7 form the polysilicon layer 101. The second polysilicon region 7 may be of any one of p- and n-types and the impurity concentration thereof may be greater or smaller than that of the first polysilicon region 3. In any case, the effect of the present invention will be provided if the heterojunction diode at least partly involves the structure of the first embodiment.

In FIG. 3, part of the first polysilicon region 3 of the structure shown in FIG. 2 is replaced with the second polysilicon region 7. It is naturally possible to replace part of the first polysilicon region 3 of the structure shown in FIG. 1 with the second polysilicon region 7 of FIG. 3.

In FIG. 8, the second polysilicon region 7 is formed between the first polysilicon region 3 and the surface metal electrode 4, to form a laminated structure with different conductivity types and different impurity concentrations. Instead of the structure of FIG. 8, the second polysilicon region 7 may be formed under the first polysilicon region 3, to sandwich the first polysilicon region 3 between the surface metal electrode 4 and the second polysilicon region 7. The second polysilicon region 7 may be of any one of p-and n-types and the impurity concentration thereof may be greater or smaller than that of the first polysilicon region 3. In any case, the effect of the present invention will be provided if the structure that can demonstrate the characteristics found by the present inventors is involved.

(Second Embodiment)

Figure 4:
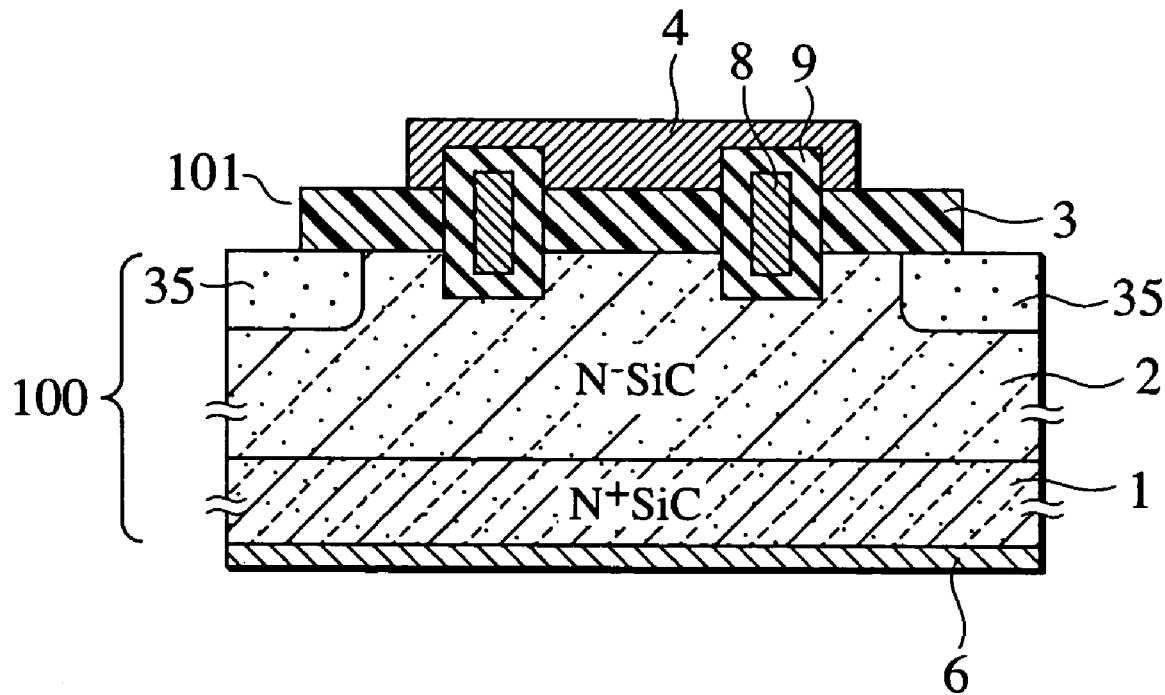
FIG. 4 is a sectional view showing a semiconductor device according to a second embodiment of the present invention.

FIG. 4 is a sectional view showing a semiconductor device according to a second embodiment of the present invention and corresponding to the structure of the first embodiment shown in FIG. 2. Parts of the second embodiment that operate like those of FIG. 2 will not be explained and parts that are specific to the second embodiment will be explained in detail.

In FIG. 4, a part of a heterojunction interface of a heterojunction diode (FIG. 2) is provided with a gate electrode 8 covered with a gate insulating film 9, to form a transistor. In FIG. 4, the second embodiment forms trenches in an epitaxial region 2. It is also possible to employ a planar structure having no trenches.

Operation of the second embodiment will be explained. For example, a surface electrode 4 is grounded and a positive potential is applied to a bottom metal electrode 6. For example, a ground potential or a negative potential is applied to the gate electrode 8, to keep a disconnected or nonconductive state. This is because a heterojunction interface between a first polysilicon region 3 and the epitaxial region 2 forms an energy barrier against conduction electrons. The second embodiment is configured to demonstrate the leakage current suppressing characteristic explained in the first embodiment, to suppress a leakage current as small as that mainly caused by carriers generated under a predetermined electric field. This secures a high disconnection ability and drastically suppresses the temperature dependence of the leakage current.

Next, a positive potential is applied to the gate electrode 8 to change the nonconductive state to a conductive state. A gate electric field extends through the gate insulating film 9 to the heterojunction interface between the first polysilicon region 3 and the epitaxial region 2. This forms an inversion layer of conduction electrons in the first polysilicon region 3 and epitaxial region 2 around the gate electrode 8. Namely, at the junction interface between the first polysilicon region 3 and the epitaxial region 2 around the gate electrode 8, a potential on the first polysilicon region 3 is pushed down and an energy barrier on the epitaxial region 2 side becomes steep. As a result, conduction electrons flow through the energy barrier.

Figure 5:
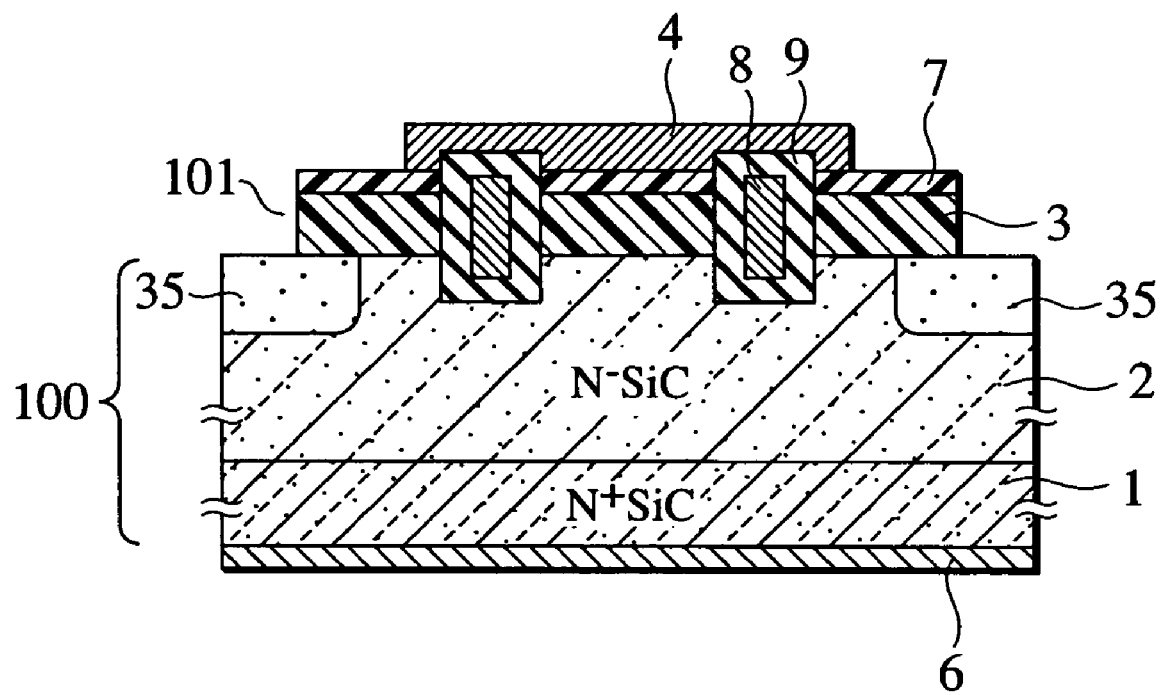
FIG. 5 is a sectional view showing another semiconductor device according to the second embodiment of the present invention.

In FIG. 4, the surface metal electrode 4 is connected to the epitaxial region 2 with the gate electrode 8 (covered with the insulating film 9) through the first polysilicon region 3. It is also possible to interpose a second polysilicon region 7 between the surface metal electrode 4 and the first polysilicon region 3 as shown in FIG. 5. Namely, the first polysilicon region 3 and second polysilicon region 7 form a polysilicon layer 101. The second polysilicon region 7 may have an optional conductivity type and an optional impurity concentration. If it employs n-type impurities, conduction electrons will easily be supplied.

Figure 6:
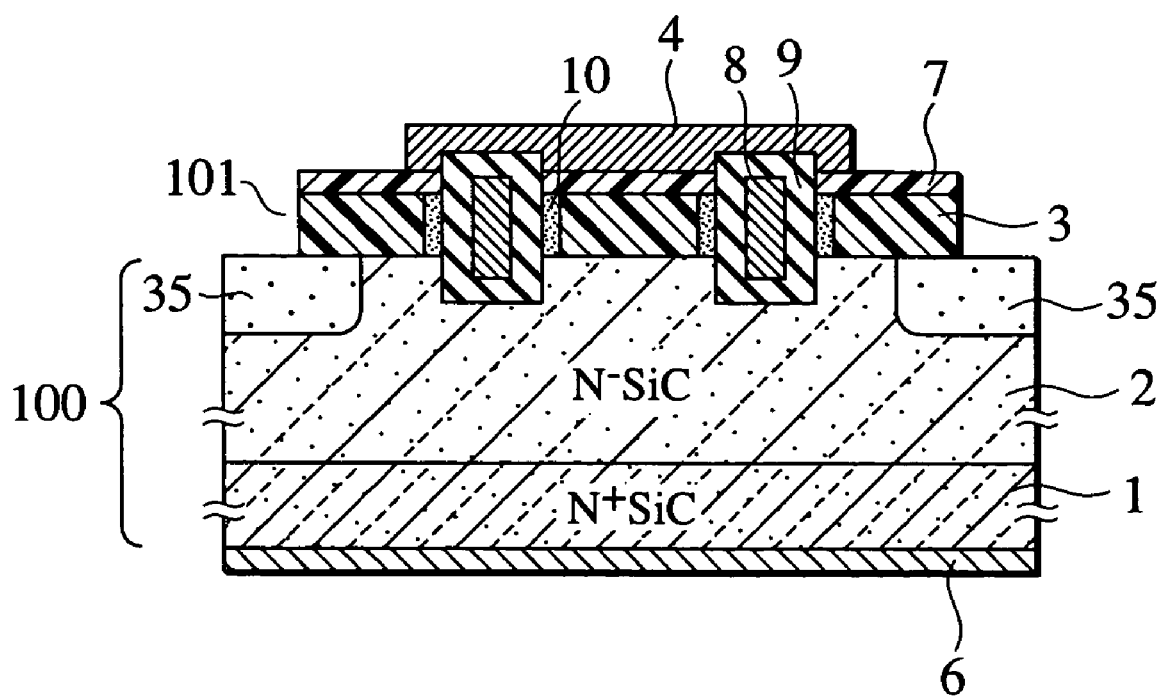
FIG. 6 is a sectional view showing still another semiconductor device according to the second embodiment of the present invention.

It is also possible to form a third polysilicon region 10 in the first polysilicon region 3 around the gate electrode 8 covered with the gate insulating film 9 as shown in FIG. 6. The first polysilicon region 3, second polysilicon region 7, and third polysilicon region 10 form a polysilicon layer 101. The third polysilicon region 10 may have an optional conductivity type and an optional impurity concentration. If the third polysilicon region 10 is of p-type and has an impurity concentration lower than that of the first polysilicon region 3, a channel to pass a current will easily invert to improve driving power.

Next, the gate electrode 8 is grounded to change the conductive state to a nonconductive state. The inversion layer of conduction electrons formed at the heterojunction interface between the first polysilicon region 3 and the epitaxial region 2 is released to stop the tunneling of the energy barrier. A flow of conduction electrons from the first polysilicon region 3 to the epitaxial region 2 stops. Conduction electrons present in the epitaxial region 2 flow to a silicon carbide substrate 1 and deplete. Then, a depletion layer extends from the heterojunction to the epitaxial region 2, to establish a disconnected state.

According to the second embodiment, the surface metal electrode 4 may be grounded and a negative potential may be applied to the bottom metal electrode 6 to establish a reverse conductive state (reflux operation) like the related art For example, the surface metal electrode 4 and gate electrode 8 are grounded and a predetermined positive potential is applied to the bottom metal electrode 6. Then, the energy barrier against conduction electrons disappears and the conduction electrons flow from the epitaxial region 2 to the first polysilicon region 3 to establish a reverse conductive state. At this time, no positive holes are injected and only the conduction electrons form the conductive state. This reduces a loss due to a reverse recovery current when the reverse conductive state shifts to a nonconductive state.

It is possible to use the gate electrode 8 as a control electrode instead of grounding the gate electrode 8.

In this way, the second embodiment employs the leakage current reducing mechanism explained in the first embodiment as a part of a switching element (transistor) that drives a heterojunction with a gate. It is also possible to use the mechanism as a freewheel diode incorporated in a part of a switching element as shown in FIGS. 9 and 10.

Figure 9:
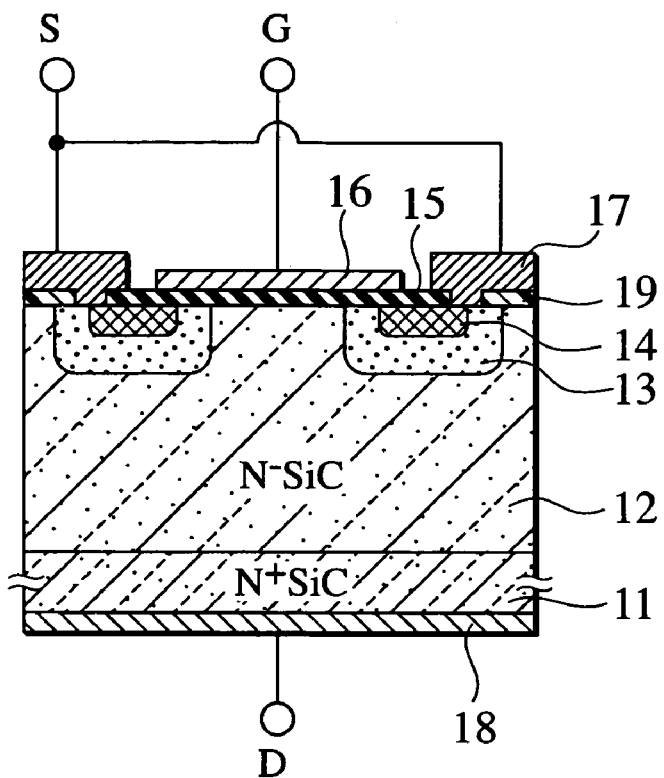
FIG. 9 is a sectional view showing still another semiconductor device according to the second embodiment of the present invention.

FIG. 9 shows a MOSFET made of silicon carbide and incorporating a heterodiode. A silicon carbide substrate 11 of a first conductivity type and an epitaxial region 12 form a semiconductor base. On the semiconductor base, there are formed a base region 13 of a second conductivity type and a source region 14 of the first conductivity type. A gate insulating film 15 is formed over the epitaxial region 12, base region 13, and source region 14, and a gate electrode 16 is formed on the gate insulating film 15. The base region 13 and source region 14 are connected to a source electrode 17. The silicon carbide substrate 11 is connected to a drain electrode 18. A first polysilicon region 19 is arranged to form a heterojunction with the epitaxial region 12. The first polysilicon region 19 has a different band gap from the epitaxial region 12 and is connected to the source electrode 17. In this way, the example of FIG. 9 employs the leakage current reducing mechanism of the present invention as a freewheel diode incorporated in a MOSFET. In this case, the mechanism can greatly reduce a leakage current at the heterojunction under a disconnected state as explained above. As a result, the semiconductor device of FIG. 9 has a high disconnection ability and can operate at high temperatures.

Figure 10:
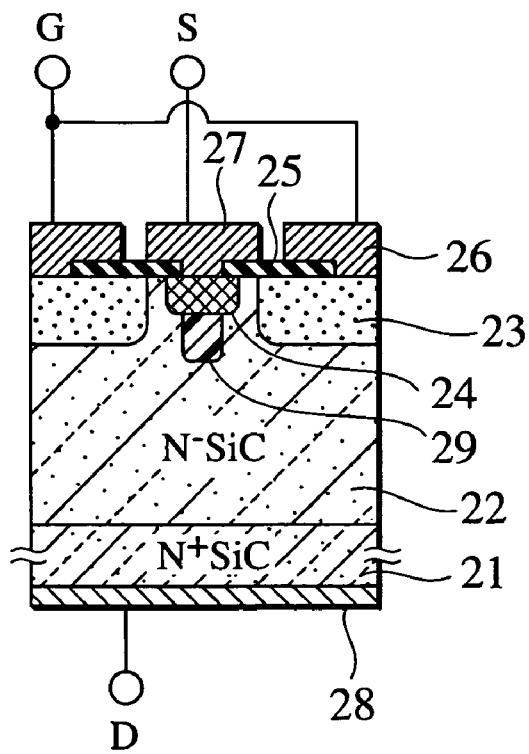
FIG. 10 is a sectional view showing still another semiconductor device according to the second embodiment of the present invention.

FIG. 10 shows a JFET made of silicon carbide with a source region 24 and a first polysilicon region 29 alternated in a depth direction. The JFET incorporates a heterodiode serving as a freewheel diode to greatly reduce a leakage current at a heterojunction in a disconnected state. As a result, the semiconductor device of FIG. 10 has a high disconnection ability and can operate at high temperatures. The semiconductor device of FIG. 10 includes a silicon carbide substrate 21, an epitaxial region 22, a base region 23, the source region 24, an insulating film 25, a gate electrode 26, a source electrode 27, a drain electrode 28, and the first polysilicon region 29.

In any case, the leakage current reducing effect of the present invention is achievable if the first polysilicon region explained in the first embodiment is at least partly included in a transistor cell.

The first and second embodiments have been explained in connection with semiconductor devices employing silicon carbide as a substrate material. The substrate material may be any other semiconductor material such as silicon, silicon germane (germanium), gallium nitride, or diamond.

Although the embodiments employ silicon carbide of polytype 4H, any other polytype such as 6H, 3C, or the like is also employable.

The embodiments employ a vertical structure in which the surface metal electrode 4 and bottom metal electrode 6 face each other with the epitaxial region 2 interposed between them to vertically pass a current. It is also possible to employ a horizontal structure in which the surface and bottom metal electrodes 4 and 6 are arranged on the same principal face to horizontally pass a current.

According to the embodiments, the first to third regions 3, 7, and 10 are made of polysilicon. Instead, they may be made of any other semiconductor material or separate semiconductor materials, if the semiconductor materials form a heterojunction with silicon carbide.

For example, it is possible to employ silicon material such as monocrystalline silicon or amorphous silicon, or any other semiconductor material such as germanium, silicon germane (germanium), or the like. A different semiconductor material provides a different built-in potential in a forward operation and a different leakage current in a reverse operation. In any case, the effect of the present invention will be provided if the material can form a heterojunction that realizes a reverse characteristic different from that of a Schottky junction diode. In this way, the semiconductor device according to the present invention is manufacturable with standard semiconductor materials through standard manufacturing processes.

According to the embodiments, the epitaxial region 2 is made of n-type silicon carbide and the first polysilicon region 3 is made of p-type polysilicon. Instead, a combination of p-type silicon carbide and n-type polysilicon is employable.

The impurity concentration of the polysilicon layer 101 must be higher than that of the silicon carbide semiconductor base 100 by a factor greater than a critical field strength ratio between the polysilicon layer 101 and the silicon carbide semiconductor base 100. Then, in a disconnected state, a potential difference applied between the silicon carbide semiconductor base 100 and the polysilicon layer 101 can be borne by the silicon carbide semiconductor base 100 having a higher critical field strength. This results in increasing the disconnection ability.

The embodiments provide the first semiconductor region with a first conductivity type and a predetermined area of the second semiconductor region with a second conductivity type. The impurity concentration, thickness, and the like of the second semiconductor region are selected not to deplete part of the second semiconductor region. As a result, the semiconductor device of the present invention shows a Schottky-junction-diode-like forward characteristic and a pn-junction-diode-like reverse characteristic. Namely, the forward characteristic of the semiconductor device of the present invention is equivalent to that of a conventional structure (for example, a Schottky diode) because a current flows based on the sum of voltage drops determined by the built-in potentials of the first and second semiconductor regions.

For the reverse characteristic of the semiconductor device according to the present invention in a disconnected state, the present invention can suppress a supply source of conduction electrons on the second semiconductor region side, to greatly reduce a leakage current passing through a heterobarrier at a heterojunction interface. Namely, the leakage current characteristic of the present invention differs from that of a conventional Schottky junction. The present invention demonstrates a very low leakage current that allows to observe a leakage current characteristic caused by carriers generated under a predetermined electric field in a pn junction diode. This characteristic has been verified with numerical calculations.

The embodiments make the thickness of the not-depleted part of the second semiconductor region greater than an electron diffusion length in the second semiconductor region, to further reduce a leakage current. This makes the semiconductor device of the present invention operate at high temperatures.

(Third Embodiment)

Figure 14:
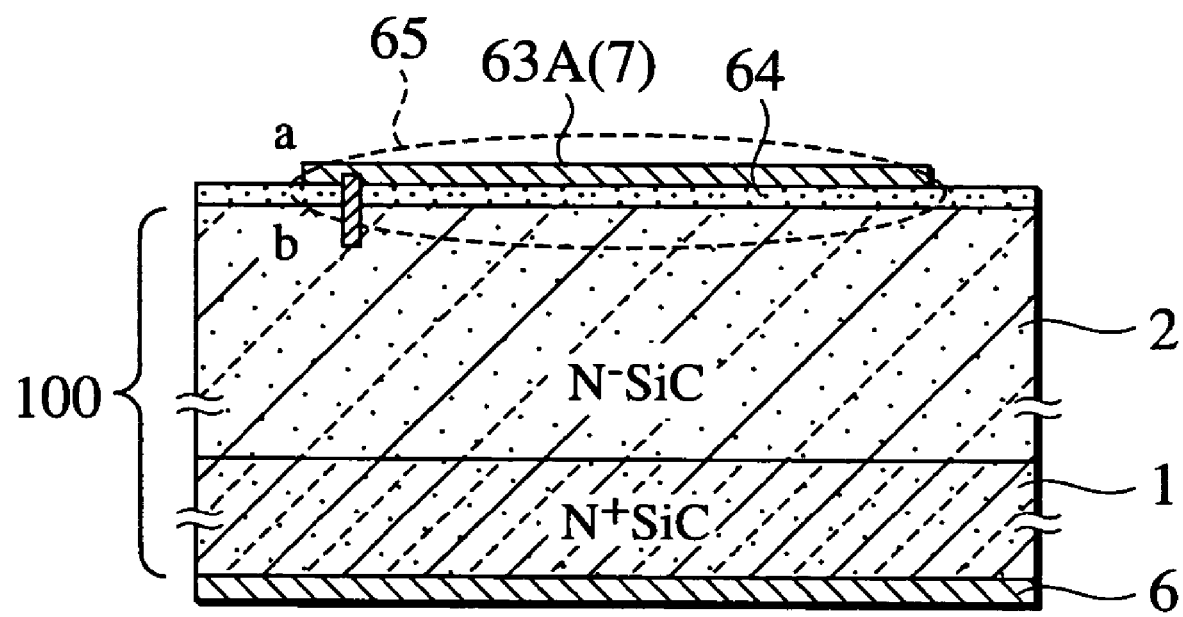
FIG. 14 is a sectional view showing a silicon carbide semiconductor device according to a third embodiment of the present invention.

FIG. 14 is a sectional view showing a silicon carbide semiconductor device according to a third embodiment of the present invention. In FIG. 14, an n$^+$-type silicon carbide substrate 1 and an n$^-$-type epitaxial region 2 formed on the substrate 1 form an n-type silicon carbide semiconductor base 100. Here, the n-type is a first conductivity type and silicon carbide is a first semiconductor material.

On a first principal face of the silicon carbide semiconductor base 100, i.e., on the epitaxial region 2, an n-type polysilicon region 63A is formed. The n-type polysilicon that forms the region 63A has a different band gap from silicon carbide and serves as a second semiconductor material. Between the epitaxial region 2 and the polysilicon region 63A, a heterojunction is formed.

On the first principal face of the silicon carbide semiconductor base 100, i.e., on the epitaxial region 2, an electric field relaxation part 65 is formed to include an impurity introduced region 64 that is in contact with the heterojunction. On a bottom face of the silicon carbide substrate 1, a cathode electrode 6 is formed from conductive material such as metal. The n-type polysilicon region 63A that is in contact with the epitaxial region 2 serves as an anode electrode 7.

Namely, the silicon carbide semiconductor device shown in FIG. 14 has a diode structure having the anode electrode 7, i.e., the n-type polysilicon region 63A and the cathode electrode 6.

A method of manufacturing the silicon carbide semiconductor device of FIG. 14 according to the third embodiment will be explained.

Figure 15A:
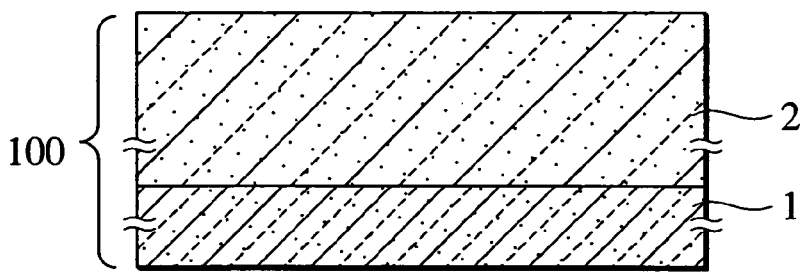
FIGS. 15A, 15B, 15C, 15D are section views for illustrating a method of manufacturing a semiconductor device according to the third embodiment of the present invention.

In FIG. 15A, an n-type silicon carbide semiconductor base 100 including an n$^+$-type silicon carbide substrate 1 and an n$^-$-type epitaxial region 2 formed on the substrate 1 is prepared. For example, the epitaxial region 2 has an impurity concentration of $1 \times 10^{16}$ cm$^{-3}$ and a thickness of 10 μm (micro meter(s)).

Figure 15B:
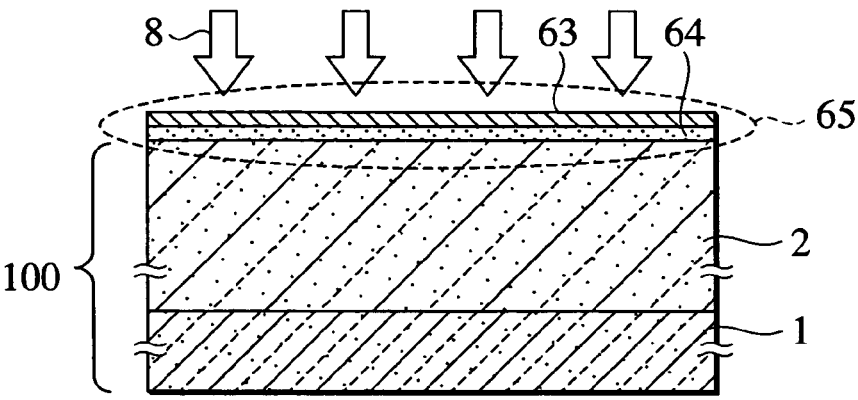

In FIG. 15B, polysilicon is deposited by LP-CVD to, for example, 1000 angstroms to form a polysilicon region 63. Phosphorus 8 is implanted into the polysilicon region 63 by ion implantation, thereby introducing impurities into the polysilicon.

This ion implantation is carried out under the conditions of, for example, 70 KeV in acceleration voltage and $1 \times 10^{14}$ cm$^{-2}$ in dose. With these conditions, the flying distance of the implanted phosphorus 8 becomes larger than the thickness of the polysilicon region 63, and therefore, the phosphorus 8 is also implanted into the epitaxial region 2 through the polysilicon region 63, to form an impurity introduced region 64. Namely, the epitaxial region 2 and polysilicon region 63 form a heterojunction, and the impurity introduced region 64 forms an electric field relaxation part 65.

Figure 15C:
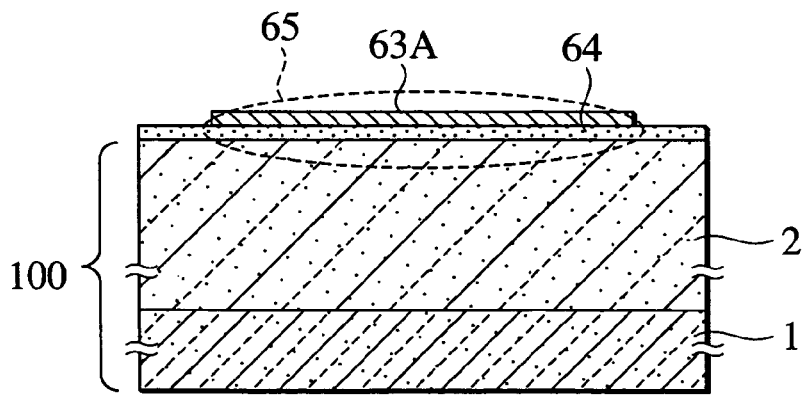

In FIG. 15C, a heat treatment is conducted for 20 minutes in a nitrogen atmosphere at 950° C. to activate the phosphorus 8 implanted in the polysilicon region 63. The polysilicon region 63 is patterned by photolithography and etching, to form an n$^-$-type polysilicon region 63A.

Figure 15D:
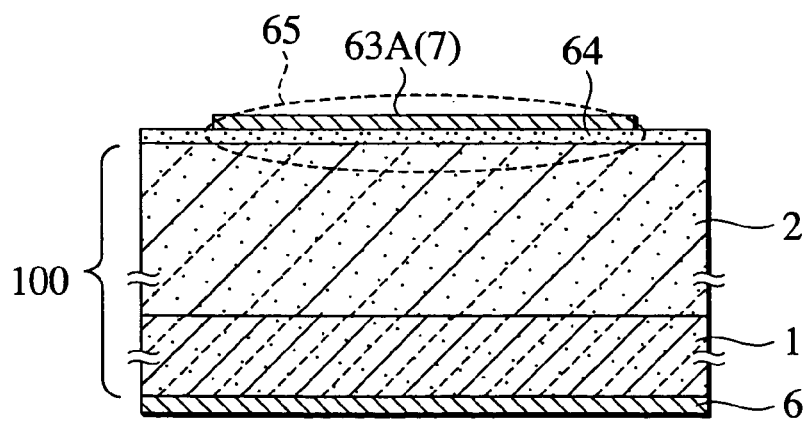

In FIG. 15D, Ti (titanium) and then Ni (nickel) are deposited on a bottom face of the n$^+$-type silicon carbide substrate 1 by spattering. RTA (rapid thermal anneal) is conducted for one minute in a nitrogen atmosphere at 1000° C., to form a cathode electrode 6. This completes the silicon carbide semiconductor device of the third embodiment shown in FIG. 14.

The method of manufacturing the silicon carbide semiconductor device according to the third embodiment deposits the polysilicon region 63, i.e., the second semiconductor material on the silicon carbide base 100, i.e., the first semiconductor material, to form a heterojunction. When introducing impurities into the polysilicon region 63, the third embodiment employs ion implantation, to precisely introduce the impurities.

The thickness of the polysilicon region 63 is thinner than the flying distance of the phosphorus 8 serving as impurities introduced into the polysilicon region 63. As a result, the impurities are introduced into the polysilicon region 63 as well as into the n$^-$-type epitaxial region 2, to form the impurity introduced region 64. This forms the electric field relaxation part 65 in a self-aligning manner.

Operation of the silicon carbide semiconductor device according to the third embodiment will be explained in connection with an energy band structure from a point "a" to a point "b" shown in FIG. 14.

Figure 16A:
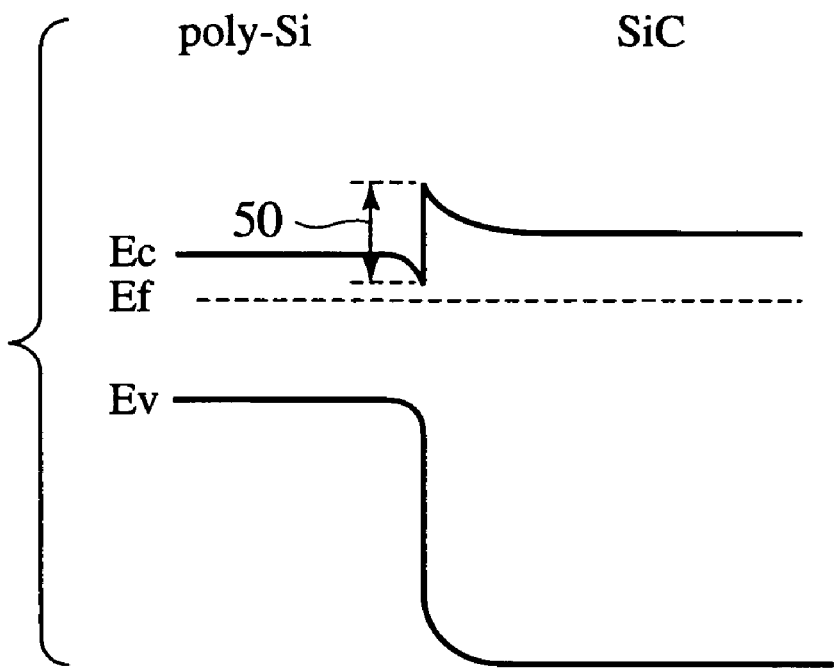
FIGS. 16A and 16B are energy band diagrams of the semiconductor device according to the third embodiment of the present invention.

FIG. 16A shows a thermal equilibrium state of an energy band structure with the n$^-$-type polysilicon region 63A (anode electrode 7) and the cathode electrode 6 being grounded.

Due to a difference between the electron affinities $x_{SiC}$ and $x_{Poly}$ of silicon carbide and n$^-$-type polysilicon, an accumulation layer is formed on the n$^-$-type polysilicon region 63A (anode electrode 7) side at a heterojunction interface under the thermal equilibrium state, and a barrier φh50 is formed at the heterojunction interface.

When a given voltage is applied to the n⁻-type polysilicon region 63A (anode electrode 7) and the cathode electrode 6 is grounded, electrons flow from the cathode electrode 6 through the silicon carbide substrate 1, epitaxial region 2, and impurity introduced region 64 to the n⁻-type polysilicon region 63A (anode electrode 7). This is a forward characteristic of the diode.

Next, the n⁻-type polysilicon region 63A (anode electrode 7) is grounded and a high voltage is applied to the cathode electrode 6. Namely, the voltage is applied in a reverse direction.

Figure 16B:
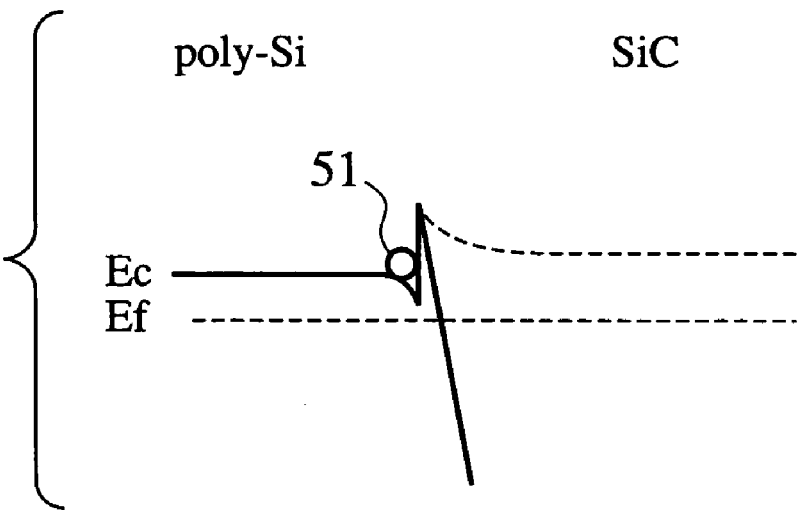

If there is no electric field relaxation part 65, a high electric field is applied to the heterojunction interface with the application of the reverse voltage. Then, the energy band structure changes to the one shown in FIG. 16B, and the barrier φh50 produced at the heterojunction interface blocks electrons 51, to maintain a disconnected or nonconductive state.

At this time, part of the electrons 51 accumulated on the polysilicon region 63A (anode electrode 7) side of the heterojunction interface tunnels through the barrier φh50 due to the application of the high electric field. These electrons try to move from the polysilicon region 63A to the epitaxial region 2. The presence of the electric field relaxation part 65 relaxes such an electric field extended to the heterojunction interface, to reduce a reverse leakage current from the heterojunction.

Figure 17:
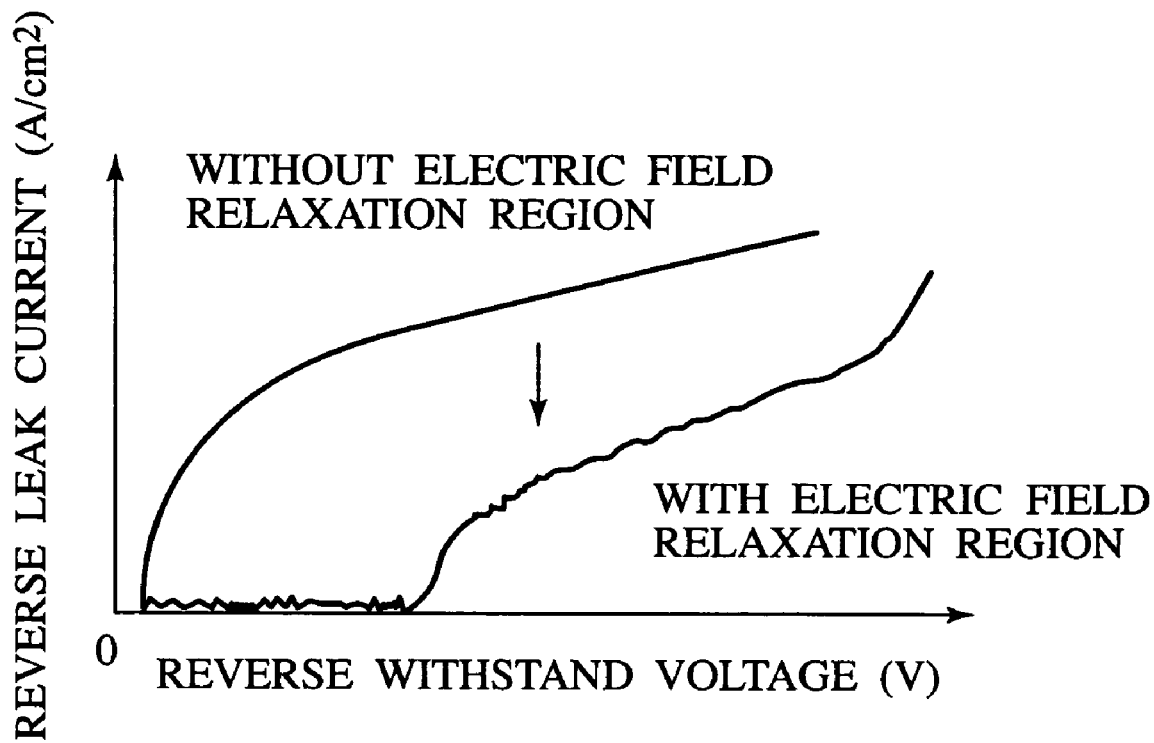
FIG. 17 shows reverse characteristics of diodes obtained from tests conducted by the present inventors on silicon carbide semiconductor devices formed according to the third embodiment.

FIG. 17 shows reverse characteristics of diodes obtained from tests conducted by the present inventors on silicon carbide semiconductor devices formed according to the third embodiment. The diode having the electric field relaxation part 65 involves a very small reverse leakage current and shows a good reverse characteristic compared with a diode having no electric field relaxation part 65. As is apparent from results of the tests, even the semiconductor device only with the heterojunction according to the third embodiment shows a high reverse withstand voltage. With the electric field relaxation part 65, the semiconductor device can further reduce a leakage current and realize a higher disconnection ability.

The silicon carbide semiconductor device according to the third embodiment is manufacturable without high-temperature activation annealing, unlike a conventional edge termination region. Accordingly, the surface of the epitaxial region 2 will not be deteriorated. When introducing impurities into the polysilicon region 63, the third embodiment can form the electric field relaxation part 65 in a self-aligning manner, to simplify manufacturing processes.

The semiconductor device of the third embodiment employs silicon carbide as the first semiconductor material to realize a high withstand voltage. In addition, the third embodiment employs polysilicon as the second semiconductor material to simplify the processes of etching and conductivity control during the manufacturing of the semiconductor device.

(Fourth Embodiment)

Figure 18:
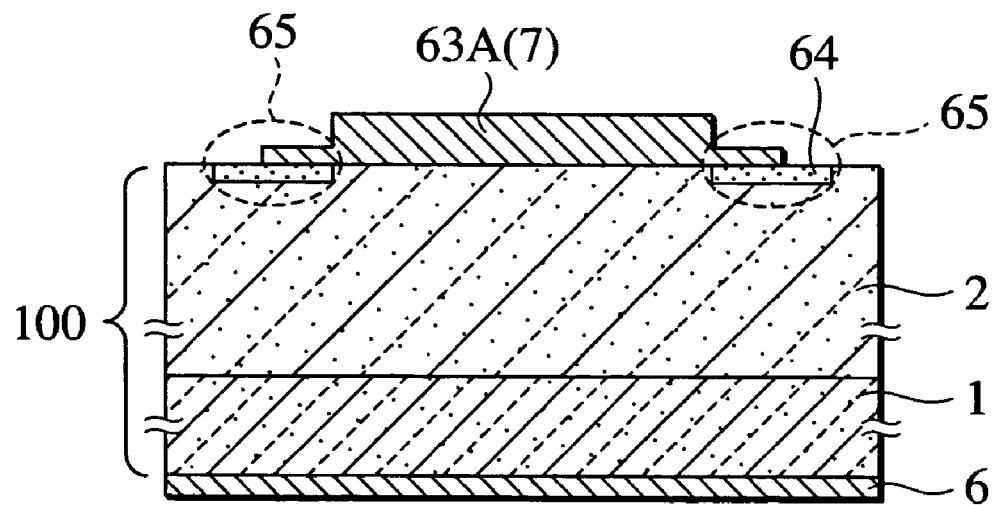
FIG. 18 is a sectional view showing a silicon carbide semiconductor device according to a fourth embodiment of the present invention.

FIG. 18 is a sectional view showing a silicon carbide semiconductor device according to a fourth embodiment of the present invention. This semiconductor device resembles that of the third embodiment but differs therefrom in that an electric field relaxation part 65 is formed only around an n⁻-type polysilicon region 63A (anode electrode 7).

A method of manufacturing the silicon carbide semiconductor device of FIG. 18 according to the fourth embodiment will be explained. The same processes as those of the third embodiment are not shown.

An n⁻-type epitaxial region 2 is formed on an n⁺-type silicon carbide substrate 1, to prepare an n-type silicon carbide semiconductor base 100. The impurity concentration and thickness of the epitaxial region 2 are, for example, $1 \times 10^{16}$ cm⁻³ and 10 μm (micro meter(s)), respectively.

Figure 19A:
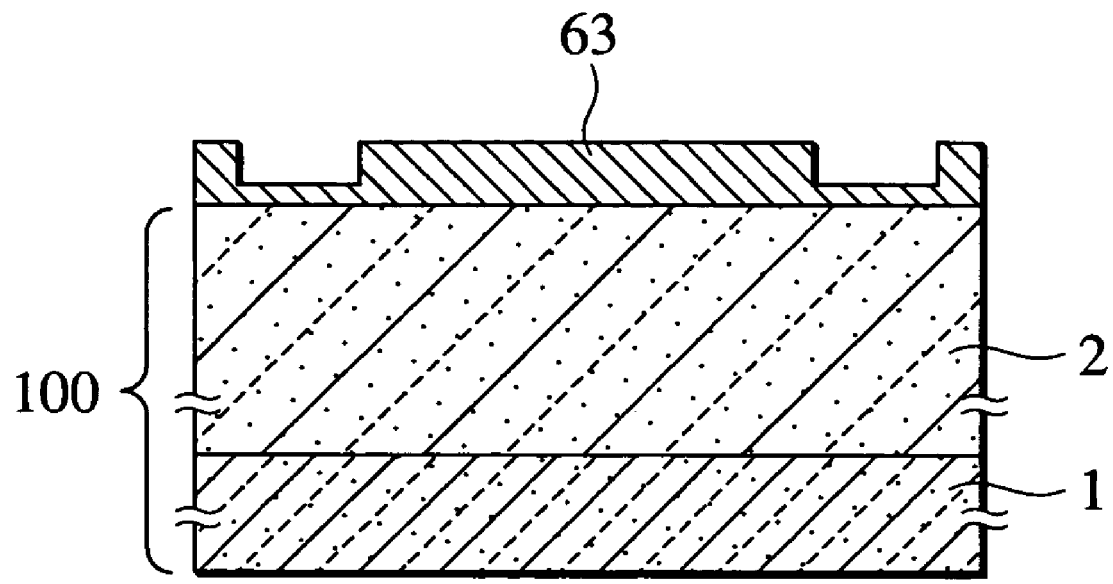
FIGS. 19A and 19B are section views for illustrating a method of manufacturing a semiconductor device according to the fourth embodiment of the present invention.

In FIG. 19A, polysilicon is deposited by LP-CVD to form a polysilicon region 63 on the semiconductor base 100. At this time, the thickness of the polysilicon region 63 is set to be greater than the flying distance of ions implanted during an impurity introducing process. If phosphorus ions are implanted at 70 KeV in acceleration voltage and $1 \times 10^{14}$ cm⁻² in dose, the thickness of the polysilicon region 63 is, for example, 5000 angstroms.

The thickness of the circumference of the polysilicon region 63 is thinned by photolithography and etching to a value smaller than the flying distance of ions to be implanted. When the above-mentioned ion implantation conditions are employed, the thickness of the circumference of the polysilicon region 63 is, for example, 1000 angstroms. In this way, the polysilicon region 63 is provided with areas having different thicknesses, i.e., an area whose thickness is greater than the ion flying distance and an area whose thickness is smaller than the ion flying distance.

Figure 19B:
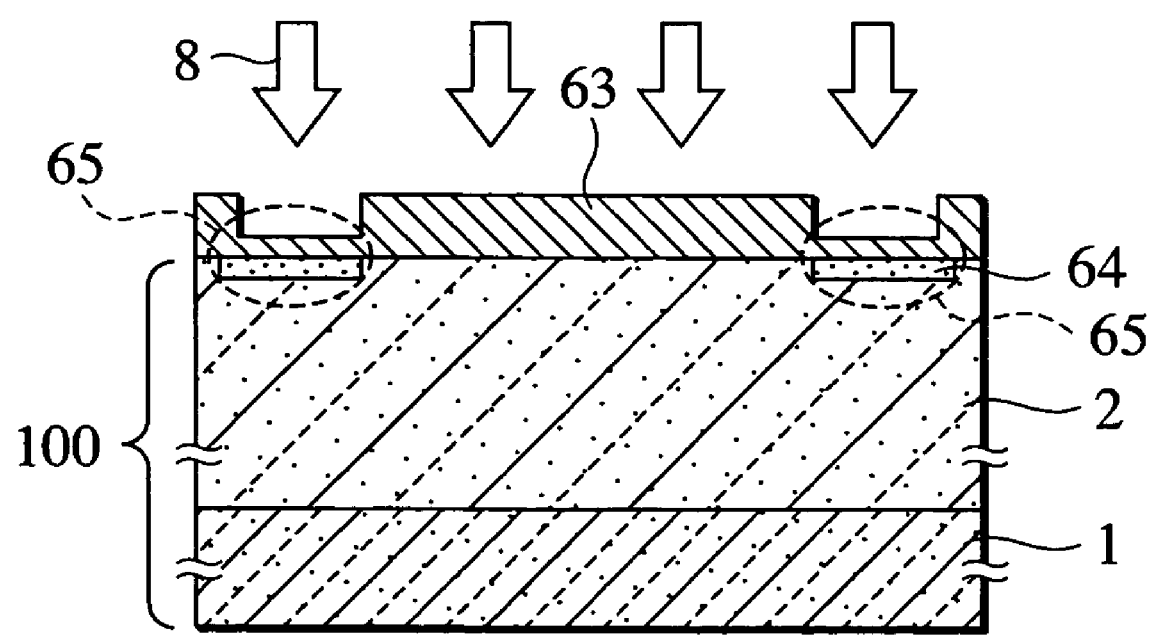

In FIG. 19B, phosphorus 8 is introduced into the polysilicon region 63 by ion implantation conducted at, for example, 70 KeV in acceleration voltage and $1 \times 10^{14}$ cm⁻² in dose. At this time, the phosphorus 8 is introduced into the epitaxial region 2 just under the area of the polysilicon region 63 whose thickness is smaller than the flying distance of the phosphorus 8, to form an impurity introduced region 64.

As a result, a heterojunction between the epitaxial region 2 and the polysilicon region 63 and the impurity introduced region 64 form an electric field relaxation part 65.

A heat treatment is conducted for 20 minutes in a nitrogen atmosphere at 950° C. to activate the phosphorus 8 implanted in the polysilicon region 63. The polysilicon region 63 is patterned by photolithography and etching to form an n⁻-type polysilicon region 63A. At this time, the polysilicon region 63 is patterned so that the perimeter of the n⁻-type polysilicon region 63A comes on the impurity introduced region 64.

On a bottom face of the n⁺-type silicon carbide substrate 1, Ti (titanium) and then Ni (nickel) are deposited by spattering. RTA (rapid thermal anneal) is carried out for one minute in a nitrogen atmosphere at 1000° C. to form a cathode electrode 6. This completes the silicon carbide semiconductor device shown in FIG. 18.

In addition to the effects of the third embodiment, the silicon carbide semiconductor device of the fourth embodiment has the electric field relaxation part 65 around the n⁻-type polysilicon region 63A (anode electrode 7) where an electric field intensively concentrates during the application of a reverse voltage. Compared with the semiconductor device having no electric field relaxation part 65, the semiconductor device of the fourth embodiment can reduce a leakage current from the periphery of the n⁻-type polysilicon region 63A (anode electrode 7), to thereby increase a withstand voltage.

In addition, the silicon carbide semiconductor device of the fourth embodiment arranges the electric field relaxation part 65 only around the n⁻-type polysilicon region 63A (anode electrode 7), to realize the same forward characteristic as a semiconductor device having no electric field relaxation part 65, a high reverse withstand voltage, and a low ON-resistance.

According to the silicon carbide semiconductor device of the fourth embodiment, the electric field relaxation part 65 is arranged around the n⁻-type polysilicon region 63A (anode electrode 7). According to a modification of the fourth embodiment shown in FIG. 20A, the polysilicon region 63 is patterned by alternating an area whose thickness is greater than the flying distance of ions to be implanted during an impurity introducing process and an area whose thickness is smaller than the ion flying distance at regular intervals. According to another modification of the fourth embodiment shown in FIG. 20B, the polysilicon region 63 is formed to a thickness thinner than the flying distance of ions to be implanted during an impurity introducing process, and a mask 52 such as an oxide film is patterned so that impurity introduced regions 64 are selectively formed in the epitaxial region 2 when impurities are introduced into the polysilicon region 63. As a result, electric field relaxation parts 65 are formed at predetermined intervals as shown in FIGS. 20C and 20D, to improve a disconnection ability when a reverse voltage is applied.

Figure 21:
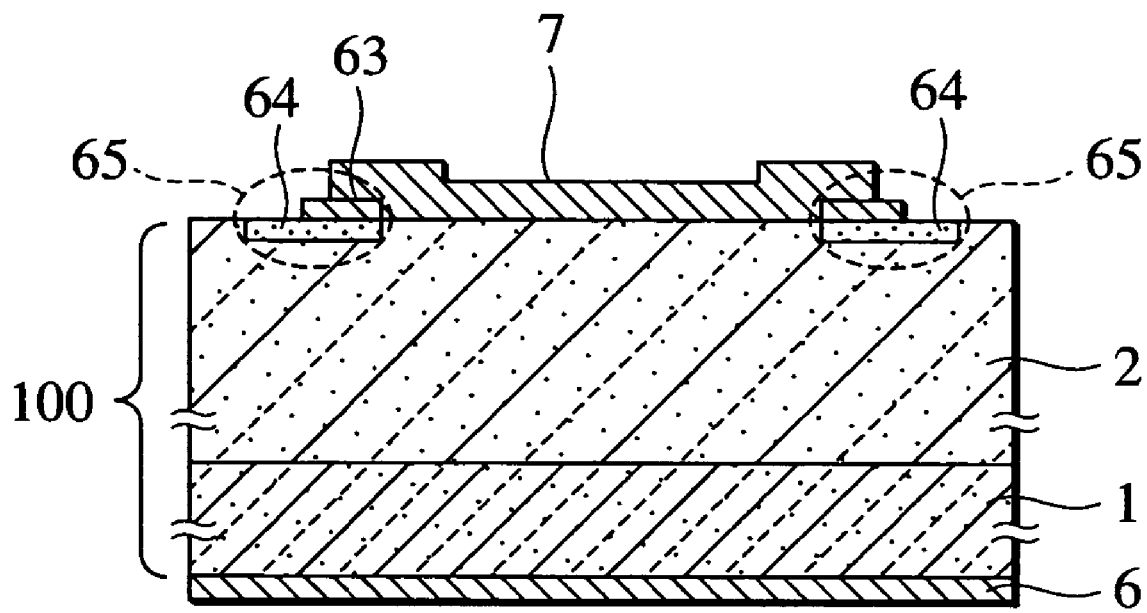
FIG. 21 is a sectional view showing another semiconductor device according to the fourth embodiment of the present invention that has anode electrode made of metal.
Figure 22:
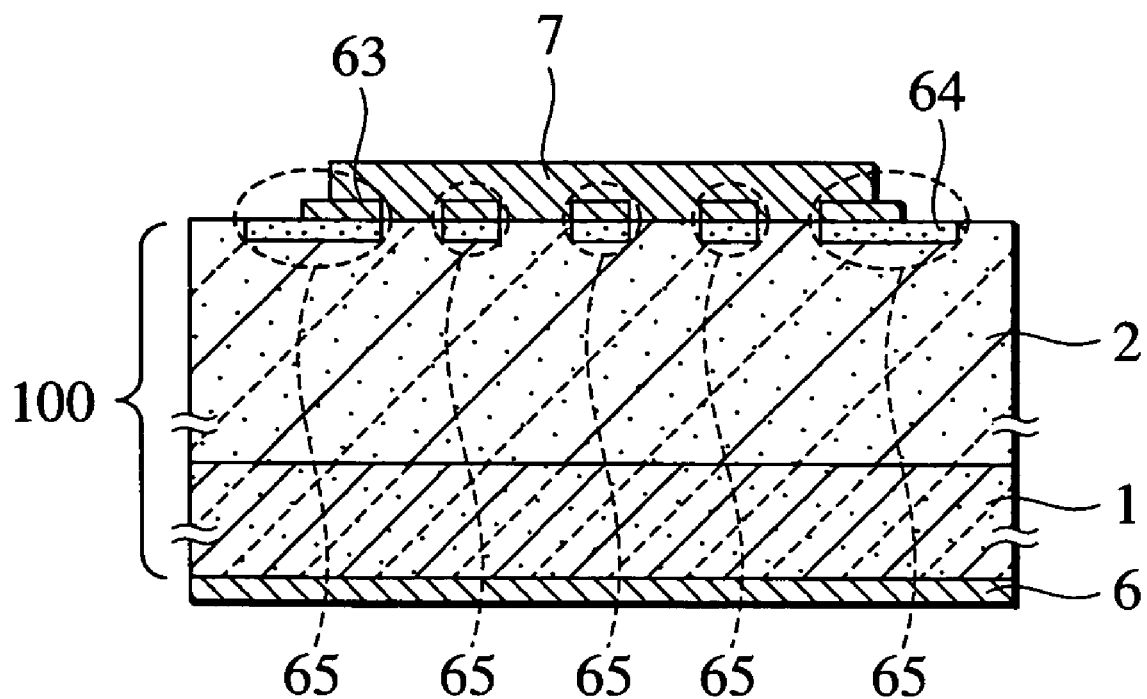
FIG. 22 is a sectional view showing still another semiconductor device according to the fourth embodiment of the present invention that has anode electrode made of metal.

According to the third and fourth embodiments, the polysilicon region 63A functions as an anode electrode. Instead, the anode electrode may be made of metal as shown in FIGS. 21 and 22. These modifications can also provide the effect of the present invention.

The third and fourth embodiments have been explained in connection with diodes. The present invention is applicable not only to diodes but also to switching elements and the like because the electric field relaxation region according to the present invention is employable as a simple edge termination as mentioned above.

(Fifth Embodiment)

Figure 23:
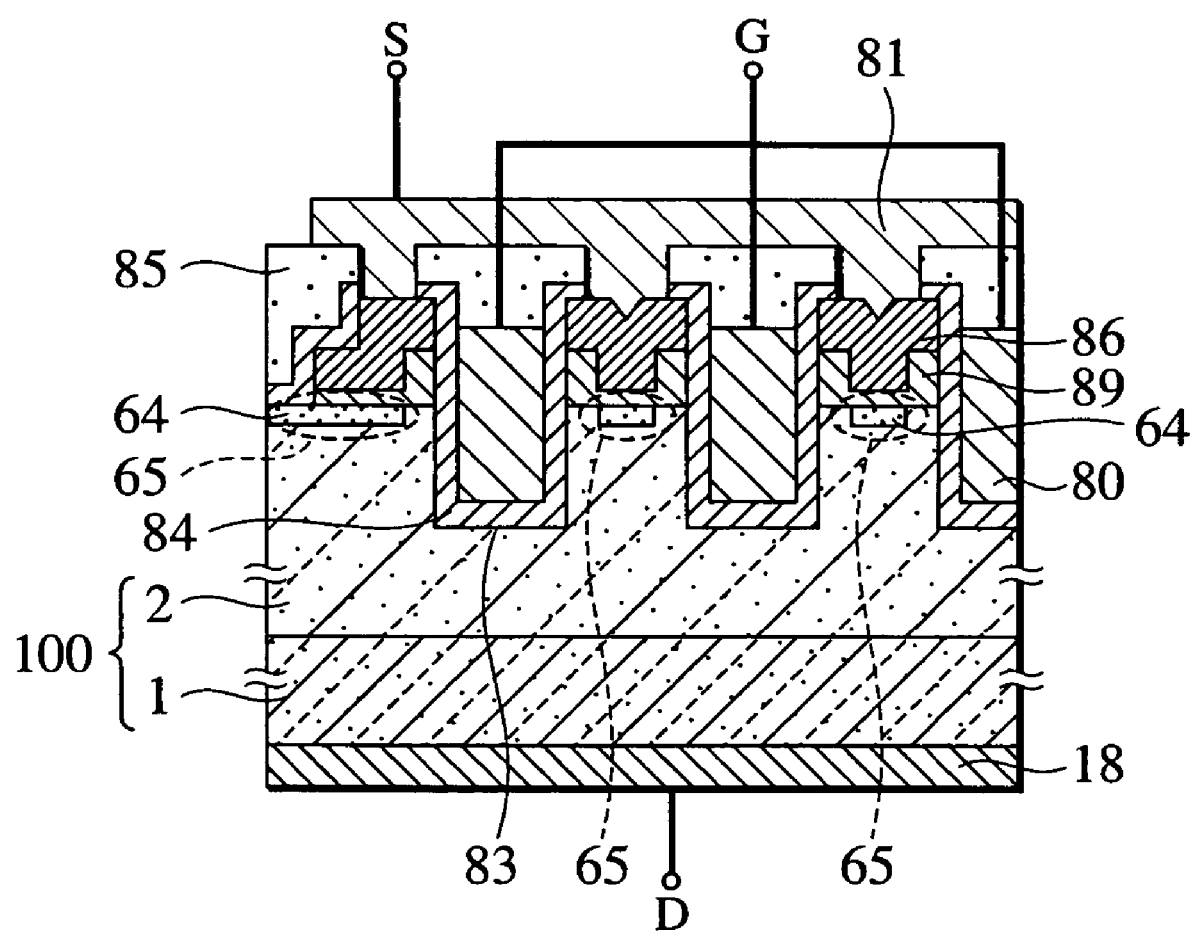
FIG. 23 is a sectional view showing a semiconductor device according to a fifth embodiment of the present invention.

FIG. 23 is a sectional view showing a silicon carbide semiconductor device according to a fifth embodiment of the present invention. This semiconductor device involves a matrix of unit cells and FIG. 23 shows sectional structures of three consecutive unit cells arranged at the periphery of the semiconductor device.

In FIG. 23, an n⁻-type epitaxial region 2 is formed on an n⁺-type silicon carbide substrate 1, to form an n-type silicon carbide semiconductor base 100. Here, n-type is a first conductivity type and silicon carbide is a first semiconductor material. On a first principal face of the silicon carbide semiconductor base 100, i.e., on the epitaxial region 2, trenches 83 are formed at predetermined intervals. At a predetermined position on the first principal face of the epitaxial region 2, a source region 89 is formed from n⁻-type polysilicon whose band gap is different from the silicon carbide semiconductor base 100. Between the epitaxial region 2 and the source region 89, a heterojunction is formed. At a predetermined position on the first principal face of the source region 89, a source contact region 86 is formed from n⁺-type polysilicon in contact with the source region 89.

On a side wall of each trench 83 and adjacent to the epitaxial region 2, source region 89, and source contact region 86, a gate insulating film 84 is formed. On the gate insulating film 84 in the trench 83, a gate electrode 80 is formed. A source electrode 81 is formed in the source contact region 86, and a drain electrode 18 is formed on a second principal face of the silicon carbide substrate 1. At the periphery of the matrix of unit cells and between the adjacent trenches 83 close to the epitaxial region 2, impurity introduced regions 64 are formed. Each impurity introduced region 64 forms an electric field relaxation part 65 that is in contact with the heterojunction. The gate electrode 80 and source electrode 81 are electrically insulated from each other with an interlayer insulating film 85.

Figure 24A:
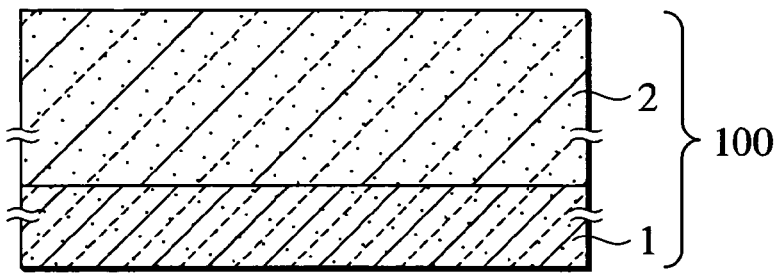
FIGS. 24A, 24B, 24C, and 24D are sectional views for illustrating a method of a manufacturing a semiconductor device according to the fifth embodiment of the present invention.

A method of manufacturing the silicon carbide semiconductor device according to the fifth embodiment shown in FIG. 23 will be explained. In FIG. 24A, an n⁻-type epitaxial region 2 is formed on an n⁺-type silicon carbide substrate 1, to prepare an n-type silicon carbide semiconductor base 100. The impurity concentration and thickness of the epitaxial region 2 are, for example, $1 \times 10^{16}$ cm⁻³ and 10 μm (micro meter(s)), respectively.

Figure 24B:
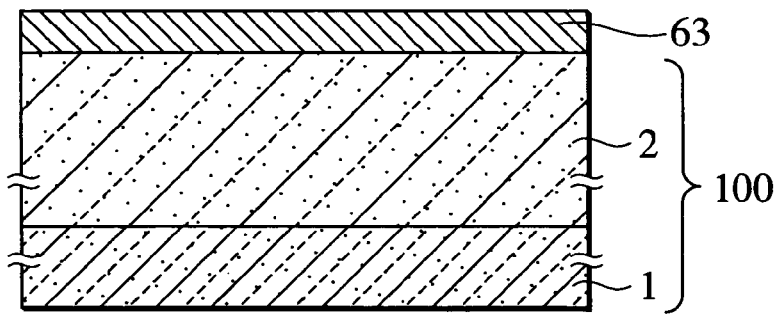

In FIG. 24B, on the epitaxial region 2 side of the silicon carbide semiconductor base 100, polysilicon is deposited by LP-CVD to form a polysilicon region 63. The thickness of the polysilicon region 63 is set to be greater than the flying distance of ions to be implanted during an impurity introducing process. If phosphorus ions are implanted under the conditions of 70 KeV in acceleration voltage and $1 \times 10^{14}$ cm⁻² in dose, the thickness of the polysilicon region 63 is, for example, 5000 angstroms.

Figure 24C:
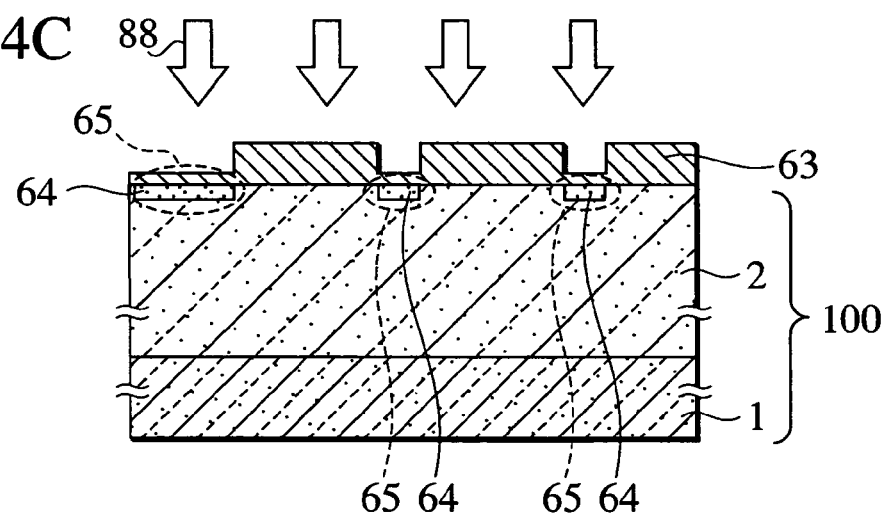

In FIG. 24C, regions having different thicknesses are formed in the polysilicon region 63 by photolithography and etching. More precisely, regions whose thickness is greater than the flying distance of ions to be implanted during the impurity introducing process and regions whose thickness is smaller than the ion flying distance are formed. Thereafter, phosphorus 88 is introduced into the polysilicon region 63 by ion implantation. As mentioned above, the ion implanting conditions are, for example, 70 KeV in acceleration voltage and $1 \times 10^{14}$ cm⁻² in dose.

At this time, the phosphorus 88 is also implanted into the epitaxial region 2 just under the regions of the polysilicon region 63 whose thickness is smaller than the flying distance of phosphorus ions, to form impurity introduced regions 64. As a result, a heterojunction between the epitaxial region 2 and the polysilicon region 63 and the impurity introduced regions 64 form electric field relaxation parts 65. A heat treatment, i.e., annealing to activate the implanted phosphorus 8 is carried out for 20 minutes in a nitrogen atmosphere at 950° C. to form an n⁻-type polysilicon region 63A.

Figure 24D:
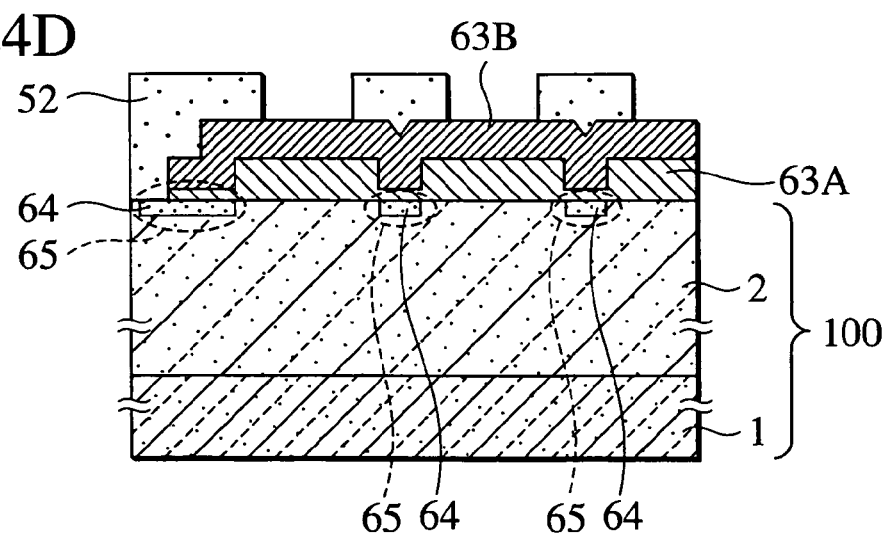

In FIG. 24D, an n⁺-type polysilicon region 63B is formed on the n⁻-type polysilicon region 63A. The regions 63A and 63B are patterned by photolithography and etching. An oxide film is deposited on the patterned regions and is patterned by photolithography and etching to form a mask 52.

Figure 25A:
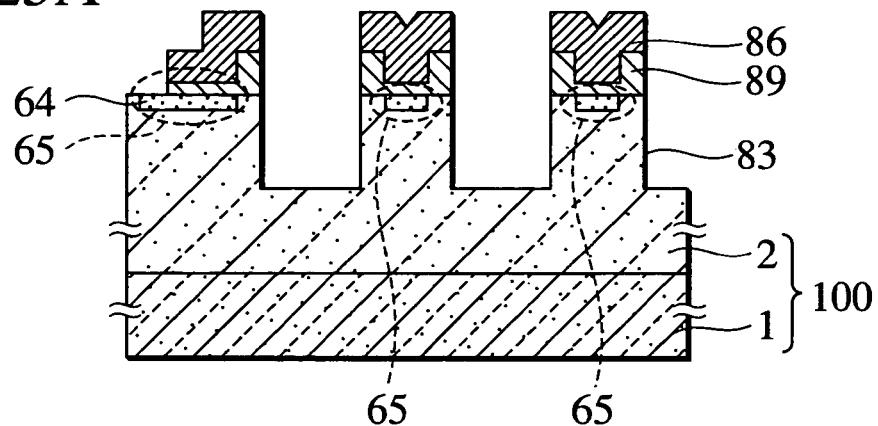
FIGS. 25A, 25B, and 25C are sectional views for illustrating a method of a manufacturing a semiconductor device according to the fifth embodiment of the present invention.

In FIG. 25A, reactive ion etching is carried out with the mask 52, to etch the n⁻-type polysilicon region 63A, n⁺-type polysilicon region 63B, and epitaxial region 2, thereby forming source regions 89, source contact regions 86, and trenches 83. Thereafter, the mask 52 is removed.

Figure 25B:
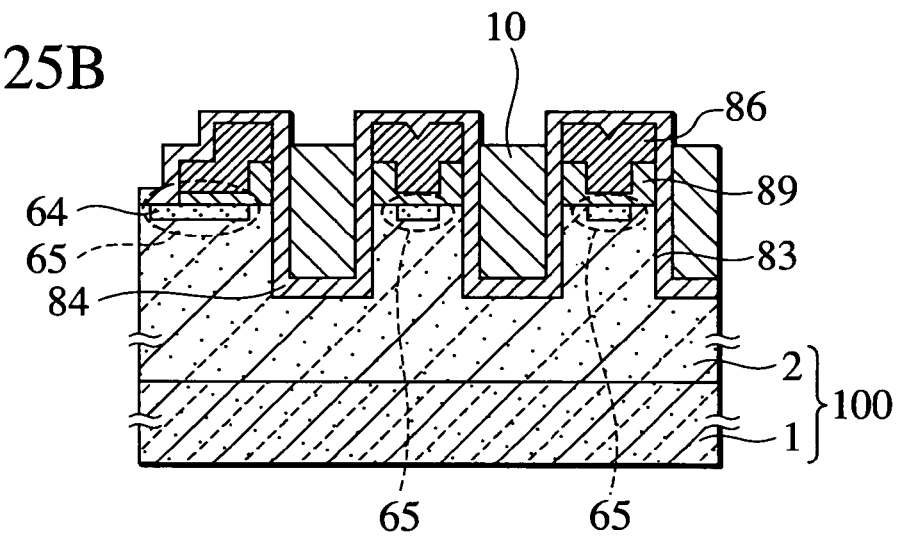

In FIG. 25B, a gate insulating film 84 is formed adjacent to the source regions 89, source contact regions 86, and epitaxial region 2 forming the side walls of the trenches 83. On the gate insulating film 84 in each trench 83, a gate electrode 80 is formed.

Figure 25C:
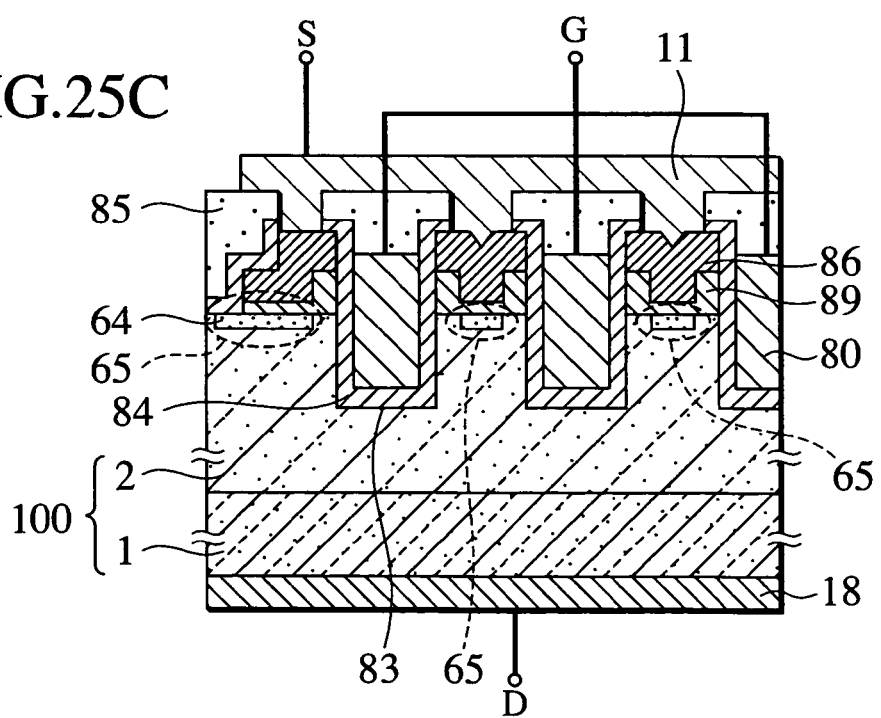

In FIG. 25C, an interlayer insulating film 85 is deposited and contact holes are formed therethrough. Source electrodes 81 are formed in the contact holes up to the source contact regions 86. On a bottom face of the silicon carbide substrate 1, a drain electrode 82 is formed. This completes the silicon carbide semiconductor device of FIG. 23.

Operation of the silicon carbide semiconductor device according to the fifth embodiment will be explained in detail. In a unit cell, the source electrode 81 is grounded and a positive drain voltage is applied to the drain electrode 18.

At this time, if the gate electrode 80 is grounded, the characteristic of the unit cell is the same as the reverse characteristic of the silicon carbide semiconductor device of the first embodiment. Namely, no current flows between the source electrode 81 and the drain electrode 18, to establish a disconnected state.

Next, a positive voltage is applied to the gate electrode 80. Adjacent to the gate insulating film 84, the source region 89 made of n⁻-type polysilicon and the epitaxial region 2 accumulate electrons. As a result, with a predetermined drain voltage, a current flows between the source electrode 81 and the drain electrode 18, to establish a conductive state.

If the positive voltage applied to the gate electrode 80 is removed, the electron accumulating layer disappears from the n⁻-type polysilicon source region 89 and epitaxial region 2 adjacent to the gate insulating film 84, and a barrier $\phi h50$ at a heterojunction interface blocks electrons, to establish a disconnected state.

The fifth embodiment arranges the electric field relaxation parts 65 made of the impurity introduced regions 64 in contact with the heterojunction at the periphery of the matrix of unit cells. Each electric field relaxation part 65 is positioned between the adjacent trenches 13 where an electric field concentrates when a drain voltage is applied. This arrangement relaxes an electric field at the periphery of the matrix of unit cells when a drain voltage is applied. Namely, the fifth embodiment realizes a high drain withstand voltage.

Although the fifth embodiment has been explained in connection with a vertical MOSFET serving as a switching element, the present invention is applicable to any type of switching element if the switching element has an active region includes a source region, a drain region, and a drive region.

For example, the fifth embodiment is applicable to unipolar devices such as MOSFET and JFET, bipolar devices such as IGBT, horizontal switching elements such as MOSFET of RESURF structure, and other switching elements.

Although the embodiments have been explained with the first conductivity type being n-type and the second conductivity type being p-type, the effects of the present invention are also achievable with the first conductivity type being p-type and the second conductivity type being n-type.

Although the embodiments have been explained with the first semiconductor material being silicon carbide and the second semiconductor material being polysilicon, the present invention is not limited to these semiconductor materials.

For example, the effects of the present invention are also achievable with wide-gap semiconductor materials such as gallium nitride, diamond, and zinc oxide and other semiconductor materials such as germanium, gallium arsenide, and indium nitride.

In this way, the present invention can form an electric field relaxation region without a high-temperature heat treatment and provide a diode or a switching element having a high withstand voltage.

(Sixth Embodiment)

Figure 26:
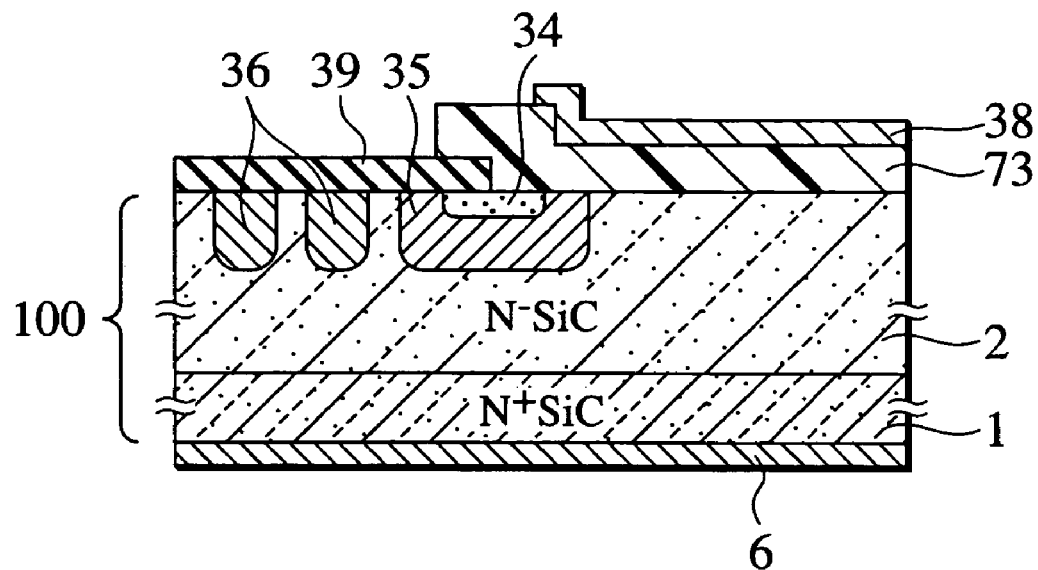
FIG. 26 is a sectional view showing a semiconductor device according to a sixth embodiment of the present invention.
Figure 27:
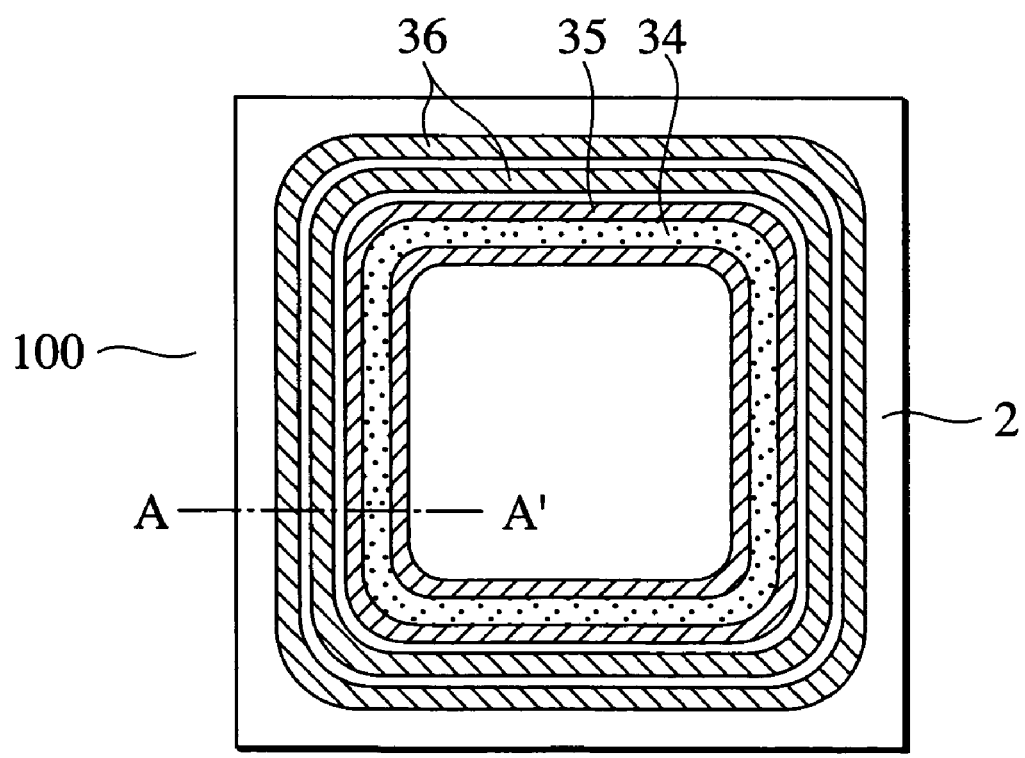
FIG. 27 is a plan view showing a chip surface of the semiconductor device according to the sixth embodiment of the present invention.

FIG. 26 is a sectional view showing a semiconductor device according to a sixth embodiment of the present invention and FIG. 27 is a plan view showing a chip surface of the semiconductor device. The structure shown in FIG. 26 corresponds to a peripheral part of the semiconductor chip taken along a line A–A' of FIG. 27. According to the sixth embodiment, the semiconductor device employs a silicon carbide semiconductor substrate.

In FIG. 26, a substrate region 1 is made of silicon carbide having a polytype of, for example, 4H. On the substrate region 1, an n⁻-type epitaxial region 2 is formed. The substrate region 1 has a specific resistance of, for example, several mΩ (milliohm(s)) cm to several tens of mΩ (milliohm(s)) cm and a thickness of, for example, about 200 to 400 μm (micro meter(s)). The epitaxial region 2 has an n-type impurity concentration of, for example, $1\times10^{15}$ to $1\times10^{18}$ cm⁻³ and a thickness of several μm (micro meter(s)) to several tens of μm (micro meter(s)). Although the sixth embodiment is explained in connection with a semiconductor body 100 made of the substrate region 1 and the epitaxial region 2 formed on the substrate region 1, the present invention is also applicable to a semiconductor base 100 made of only a substrate region 1 having an optional specific resistance.

On a principal face of the epitaxial region 2 opposite to a junction face between the epitaxial region 2 and the substrate region 1, there is deposited a first polysilicon region 73 serving as a second semiconductor layer and having a band gap smaller than silicon carbide. The first polysilicon region 73 is doped with p-type impurities of high concentration. The epitaxial region 2 and first polysilicon region 73 form a heterojunction between them. Namely, the heterojunction is made of silicon carbide and polysilicon having different band gaps and involves an energy barrier. In FIG. 27, the first polysilicon region 73 and a surface metal electrode 38 formed on the region 73 are omitted for the sake of easy understanding of the positional relationships among regions formed in the epitaxial region 2.

In contact with a peripheral edge of the junction between the epitaxial region 2 and the first polysilicon region 73, there are formed a p⁺-type punch-through preventive region 34 and a p⁻-type electric field relaxation region 35 whose impurity concentration is smaller than that of the punch-through preventive region 34. According to the sixth embodiment, the first polysilicon region 73 and punch-through preventive region 34 have high impurity concentrations and form an ohmic contact between them. According to the sixth embodiment, the punch-through preventive region 34 and electric field relaxation region 35 are annularly formed as shown in FIG. 27. In FIG. 26, the punch-through preventive region 34 is separated from the epitaxial region 2. The punch-through preventive region 34 may partly be in contact with the epitaxial region 2. Around the electric field relaxation region 35, a guard ring region 36 of, for example, p-type is formed. According to the sixth embodiment, the guard ring region 36 is made of two floating rings. The number of guard rings is optional, and it is possible to arrange no guard ring. According to the sixth embodiment, the depth of the guard ring region 36 is the same as that of the electric field relaxation region 35. Instead, the depth of the guard ring region 36 may be deeper or shallower than the depth of the electric field relaxation region 35. If the guard ring region 36 is provided, it is preferable to form the guard ring region 36 together with one or both of the punch-through preventive region 34 and electric field relaxation region 35, to simplify manufacturing processes.

On a bottom face of the substrate region 1, a bottom metal electrode 6 is formed. The bottom metal electrode 6 is ohmic-connected to the substrate region 1 and is made of, for example, Ti (titanium) and Ni (nickel) deposited on the Ti.

On the surface of the first polysilicon region 73, a surface metal electrode 38 is formed. The surface metal electrode 38 is ohmic-connected to the first polysilicon region 73 and is made of, for example, Ti (titanium) and Al (aluminum) deposited on the Ti.

Figure 28:
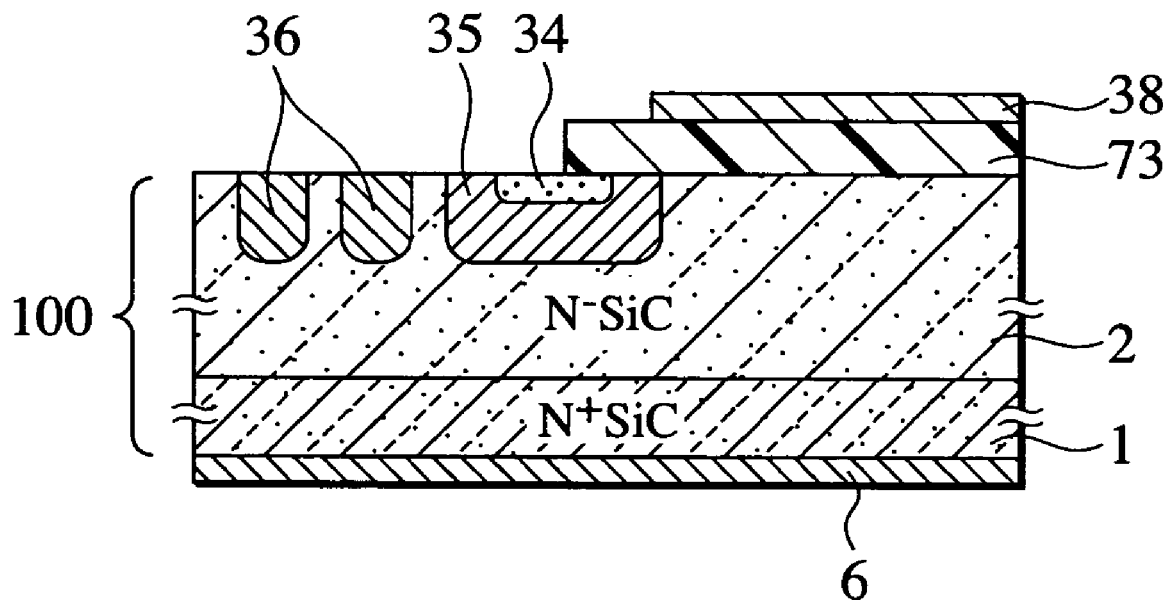
FIG. 28 is a sectional view showing a sectional view showing another semiconductor device according to the sixth embodiment of the present invention.

In FIG. 26, an end of the first polysilicon region 73 overlaps an interlayer insulating film 39. The interlayer insulating film 39 may be omitted as shown in FIG. 28.

According to the sixth embodiment, the surface metal electrode 38 serves as an anode and the bottom metal electrode 6 as a cathode, to form a vertical diode.

Operation of the sixth embodiment will be explained. At first, the bottom metal electrode 6 is grounded and a positive potential is applied to the surface metal electrode 38. Then, the diode shows a forward characteristic and operates like a Schottky junction diode. Namely, a current flows according to a voltage drop that is determined by the sum of built-in potentials extended from the heterojunction to the epitaxial region 2 and first polysilicon region 73. According to the sixth embodiment, the sum of the built-in potentials extended from the heterojunction to the epitaxial region 2 and first polysilicon region 73 is about 1.3 V, and a voltage drop corresponding to the sum causes a flow of forward current.

At this time, a forward bias is applied between the electric field relaxation region 35 and the epitaxial region 2. These regions are made of silicon carbide to form a pn junction where a built-in potential is about 3 V that is higher than that at the heterojunction. As a result, the pn junction is inactive. Namely, the sixth embodiment operates like a monopolar diode in the forward operation.

Next, the surface metal electrode 38 is grounded and a positive potential is applied to the bottom metal electrode 6. Then, the diode shows a reverse characteristic to establish a disconnected or nonconductive state. Namely, according to the potential applied to the bottom metal electrode 6, a depletion layer extends from the heterojunction between the epitaxial region 2 and the first polysilicon region 73 and from the pn junction between the epitaxial region 2 and the electric field relaxation region 35. At this time, the impurity concentration of the electric field relaxation region 35 is small according to the sixth embodiment, and therefore, the depletion layer extends not only on the epitaxial region 2 side but also on the electric field relaxation region 35 side. A maximum electric field appears along the peripheral edge of the first polysilicon region 73 at a junction between the electric field relaxation region 35 and the epitaxial region 2. The depletion layer relaxes the curvature of the electric field along the peripheral edge to bring a withstand voltage at the peripheral edge closer to that at a planar part.

If the impurity concentration of the electric field relaxation region 35 is reduced like the related art, the depletion layer reaches the first polysilicon region 73 when the electric field relaxation region 35 is entirely depleted. As a result, a leakage current flows from an end of the first polysilicon region 73. Compared with monometallic Schottky metal or monocrystalline silicon, polysilicon that forms the region 73 is a collection of crystal grains, and therefore, sharply increases a leakage current when it is exposed to an electric field at the peripheral edge. The sixth embodiment, however, arranges the punch-through preventive region 34 in contact with the first polysilicon region 73, to block the depletion layer. Accordingly, the sixth embodiment can improve the withstand voltage of the epitaxial region 2 and suppress a leakage current at the edge of the first polysilicon region 73, thereby realizing a higher withstand voltage and a higher disconnection ability compared with the related art.

If a higher potential is applied to the bottom metal electrode 6, an avalanche breakdown will occur between the epitaxial region 2 and the electric field relaxation region 35. Positive holes generated at this time are quickly discharged with low resistance through the punch-through preventive region 34 to the ohmic-connected first polysilicon region 73. Namely, the avalanche breakdown occurs substantially uniformly along the periphery of the annular punch-through preventive region 34, and therefore, an avalanche breakdown current hardly concentrates. This results in improving an avalanche resistance.

Figure 29:
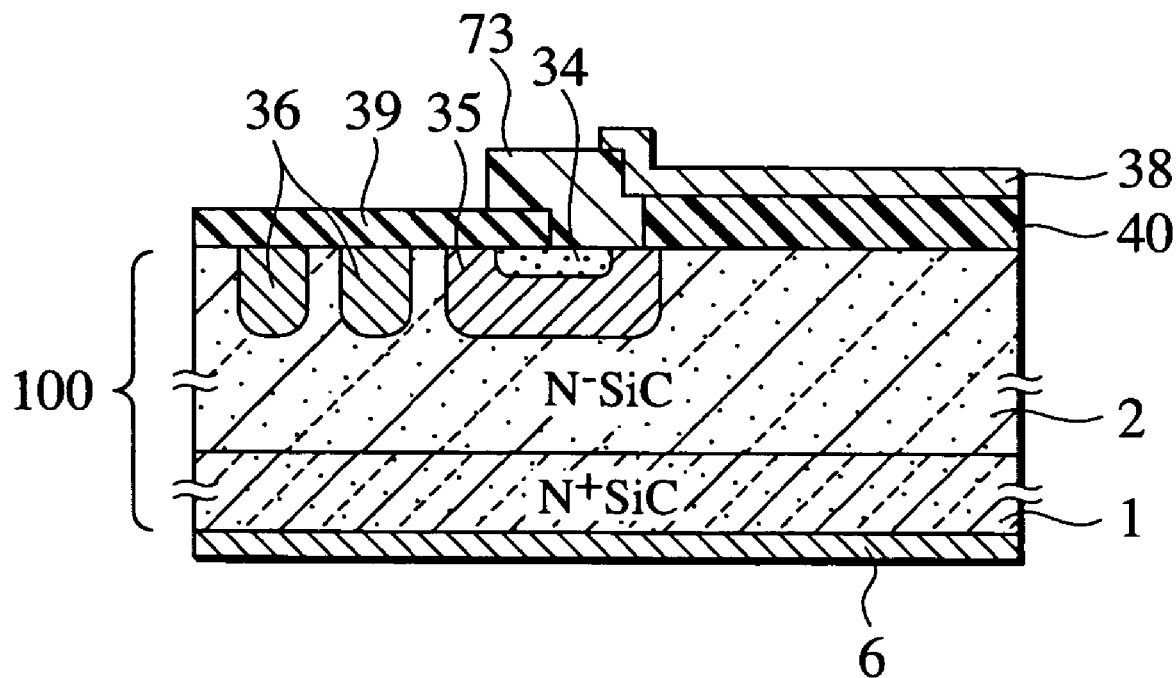
FIG. 29 is a sectional view showing a sectional view showing still another semiconductor device according to the sixth embodiment of the present invention.

In this way, the sixth embodiment realizes the same forward characteristic as the related art and improves a reverse withstand voltage. In FIG. 26, a heterodiode formed at the center of the hetero-semiconductor element (FIG. 27) involves the first polysilicon region 73 having a high concentration of p-type impurities like the peripheral part thereof. Instead, an n-type second polysilicon region 40 may be formed as shown in FIG. 29. Namely, the second polysilicon region 40 may have a different conductivity type or a different impurity concentration from the first polysilicon region 73.

Figure 30:
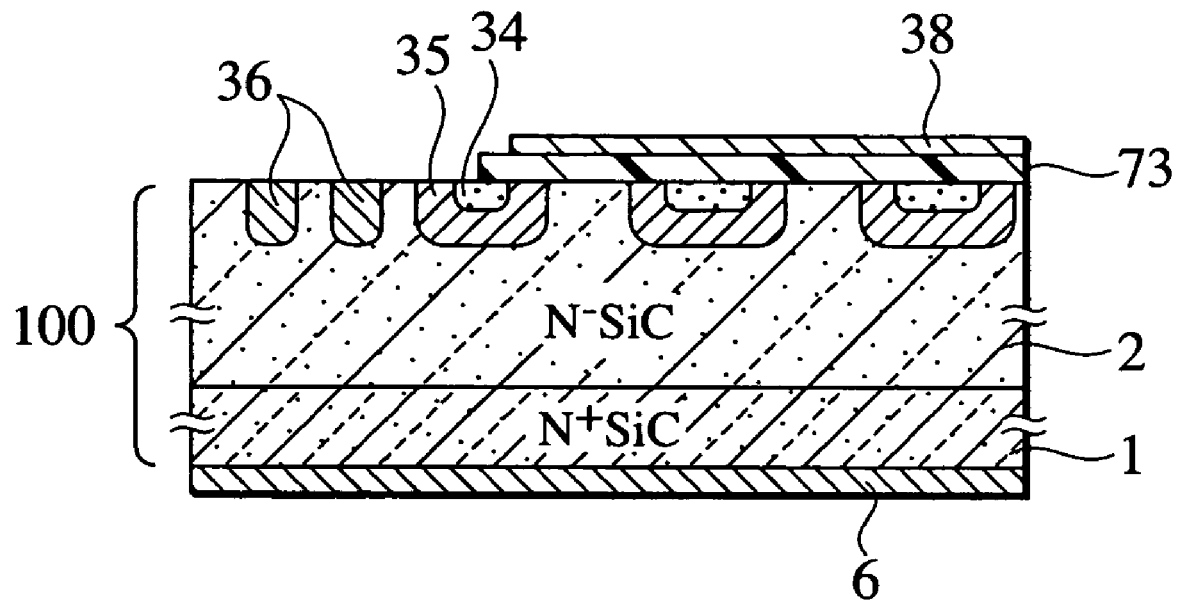
FIG. 30 is a sectional view showing a sectional view showing still another semiconductor device according to the sixth embodiment of the present invention.

As explained above, the sixth embodiment forms the punch-through preventive region 34 around the hetero-semiconductor element. It is possible to arrange the punch-through preventive region 34 at a location other than the periphery of the hetero-semiconductor element For example, as shown in FIG. 30, the punch-through preventive regions 34 may be formed in contact with a circumferential area of the first polysilicon region 73 or of the second polysilicon region 40, to improve a disconnection ability at the circumferential area (Seventh Embodiment)

Figure 31:
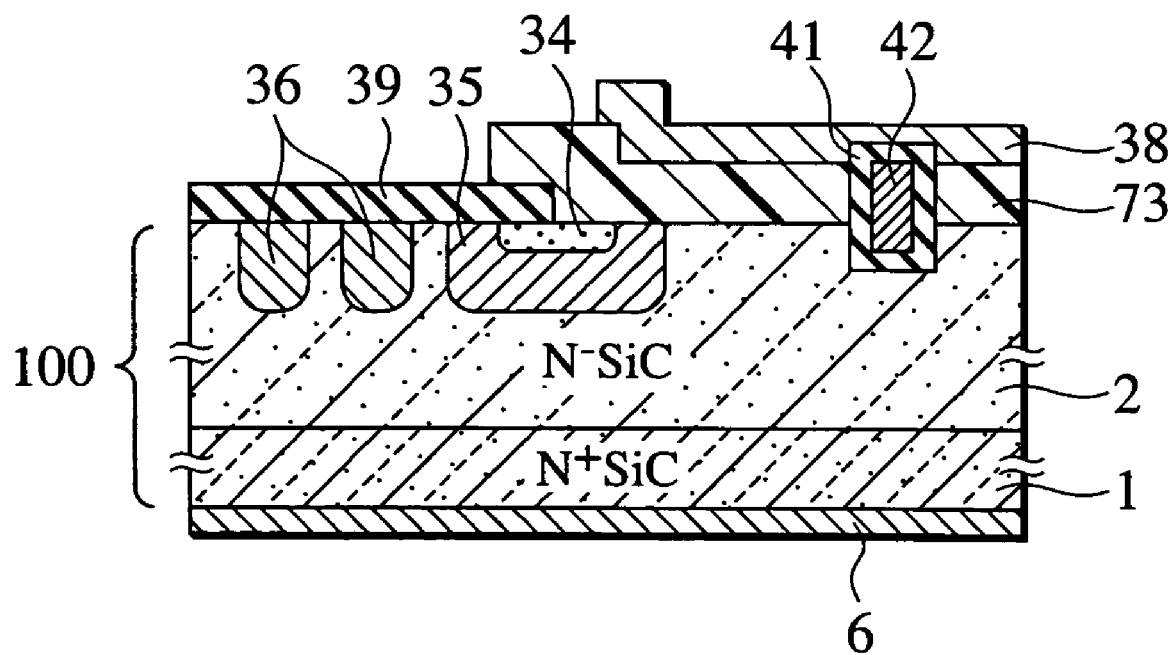
FIG. 31 is a sectional view showing a sectional view showing a semiconductor device according to a seventh embodiment of the present invention.

FIG. 31 is a sectional view showing a semiconductor device according to a seventh embodiment of the present invention. In FIG. 31, a part of the heterojunction interface of the heterojunction diode of FIG. 26 is provided with a gate insulating film 41 and a gate electrode 42 to form a transistor. Although the seventh embodiment forms a trench in an epitaxial region 2, the present invention is also applicable to a planar structure without trenches.

Operation of the seventh embodiment will be explained. For example, a surface metal electrode 38 is grounded and a positive potential is applied to a bottom metal electrode 6. For example, a ground potential or a negative potential is applied to the gate electrode 42, to keep a disconnected or nonconductive state. This is because a heterojunction interface between a first polysilicon region 73 and the epitaxial region 2 forms an energy barrier against conduction electrons. As explained in the sixth embodiment, the seventh embodiment forms a punch-through preventive region 34 to prevent the generation of a leakage current at an edge of the first polysilicon region 73, as well as an electric field relaxation region 35 of low impurity concentration to bring a withstand voltage at the edge of the first polysilicon region 73 closer to a withstand voltage at a planar part of the epitaxial region 2. This configuration secures a higher disconnection ability.

Figure 32:
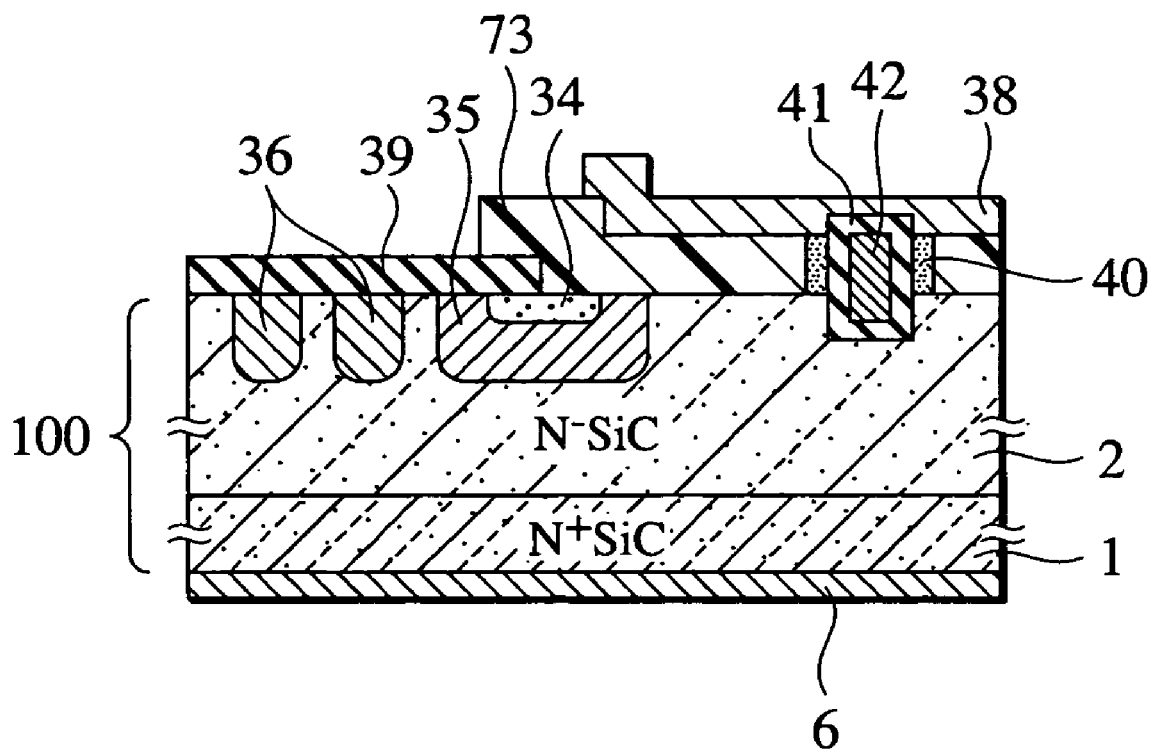
FIG. 32 is a sectional view showing a sectional view showing another semiconductor device according to the seventh embodiment of the present invention.

Next, a positive potential is applied to the gate electrode 42 to change the disconnected state to a conductive state. A gate electric field extends through the gate insulating film 41 to the heterojunction interface between the first polysilicon region 73 and the epitaxial region 2. This forms an inversion layer of conduction electrons in the first polysilicon region 73 and epitaxial region 2 around the gate electrode 42. Namely, at the junction interface between the first polysilicon region 73 and the epitaxial region 2 around the gate electrode 42, a potential on the first polysilicon region 73 is pushed down and an energy barrier on the epitaxial region 2 side becomes steep. As a result, conduction electrons flow through the energy barrier. In FIG. 31, the first polysilicon region 73 is formed in contact with the gate insulating film 41. Instead, a second polysilicon region 40 may be interposed between the gate insulating film 41 and the first polysilicon region 73 as shown in FIG. 32. The conductivity type and impurity concentration of the second polysilicon region 40 are optional. For example, the second polysilicon region 40 may have a high concentration of n-type impurities to easily accumulate a channel for passing a current and improve driving power.

Next, the gate electrode 42 is grounded to change the conductive state to a nonconductive state. The inversion layer of conduction electrons formed at the heterojunction interface between the first polysilicon region 73 and the epitaxial region 2 is released to stop the tunneling of the energy barrier. A flow of conduction electrons from the first polysilicon region 73 to the epitaxial region 2 stops. Conduction electrons present in the epitaxial region 2 flow to a silicon carbide substrate 1 and deplete. Then, a depletion layer extends from the heterojunction to the epitaxial region 2, to establish a disconnected state.

According to the seventh embodiment, the surface metal electrode 38 may be grounded and a negative potential may be applied to the bottom metal electrode 6 to establish a reverse conductive state (reflux operation) like the related art.

For example, the surface metal electrode 38 and gate electrode 42 are grounded and a predetermined positive potential is applied to the bottom metal electrode 6. Then, the energy barrier against conduction electrons disappears and the conduction electrons flow from the epitaxial region 2 to the first polysilicon region 73 to establish a reverse conductive state. At this time, no positive holes are injected and only the conduction electrons form the conductive state. This reduces a loss due to a reverse recovery current when the reverse conductive state shifts to a nonconductive state. It is possible to use the gate electrode 42 as a control electrode without grounding the same.

(Eighth Embodiment)

Figure 33:
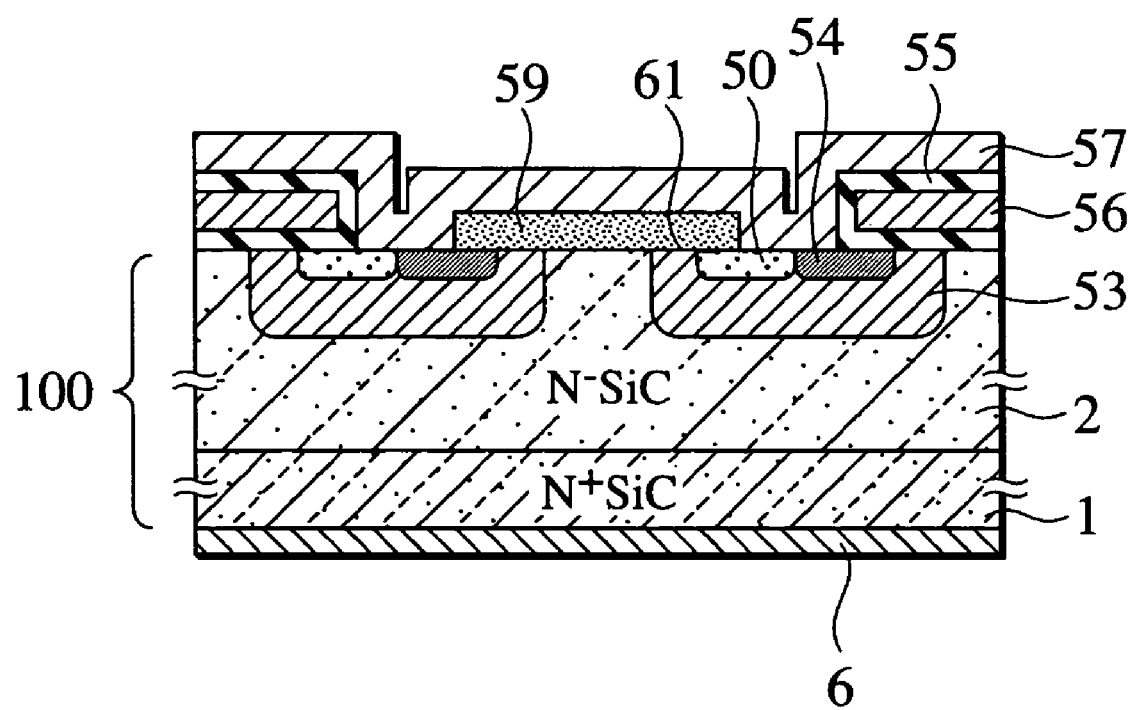
FIG. 33 is a sectional view showing a sectional view showing a semiconductor device according to an eighth embodiment of the present invention.

FIG. 33 is a sectional view showing a semiconductor device according to an eighth embodiment of the present invention. The preceding embodiments employ the leakage current reducing structure of the first embodiment as a part of a switch that drives a heterojunction with a gate. The eighth embodiment of FIG. 33 employs a heterojunction as a freewheel diode incorporated in a part of a switching element. The structure shown in FIG. 33 is a silicon carbide MOSFET incorporating a heterodiode. In FIG. 33, a silicon carbide substrate 1 of a first conductivity type and an epitaxial region 2 form a semiconductor base 100. On the semiconductor base 100, a base region 53 of a second conductivity type and a source region 54 of the first conductivity type are formed. In contact with the epitaxial region 2, base region 53, and source region 54, a gate insulating film 55 and a gate electrode 56 are formed. The base region 53 and source region 54 are connected to a source electrode 57. The silicon carbide substrate 1 is connected to a bottom metal electrode 6 serving as a drain electrode. A first polysilicon region 59 is formed from, for example, polysilicon having a different band gap from the epitaxial region 2. The epitaxial region 2 and first polysilicon region 59 form a heterojunction. The first polysilicon region 59 is connected to the source electrode 57. According to the eighth embodiment, a punch-through preventive region 50 and an electric field relaxation region 61 are formed in contact with an end of the first polysilicon region 59. In FIG. 33, the electric field relaxation region 61 and base region 53 are simultaneously formed into an integrated structure. Instead, they may be formed into separate structures. For the MOSFET with the heterojunction serving as a built-in freewheel diode, the punch-through preventive region 50 can prevent a leakage current. Like the seventh embodiment, the eighth embodiment can reduce a leakage current at the heterojunction in a disconnected or nonconductive state, to thereby realize a high disconnection ability.

As explained above, the leakage current reducing effect of the present invention is achievable in a semiconductor device if at least a part of the semiconductor device involves the punch-through preventive region 50 of the present invention at an end of the first polysilicon region 59 made of, for example, polysilicon.

Figure 34:
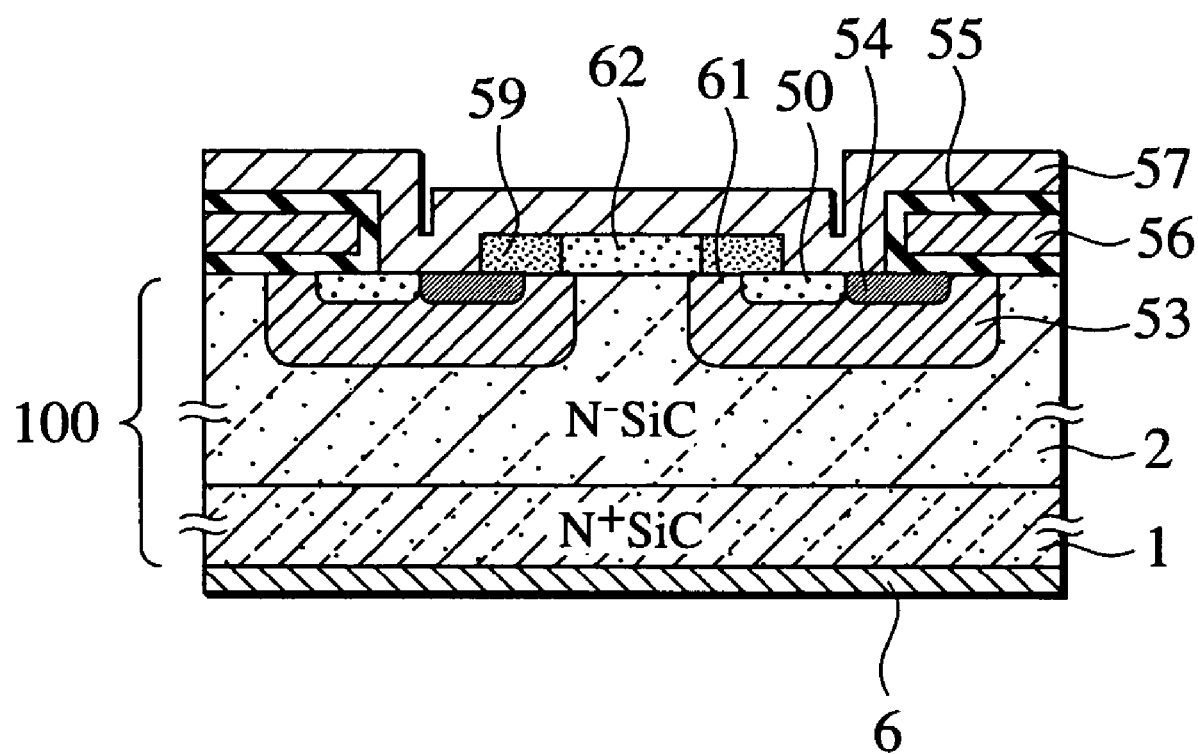
FIG. 34 is a sectional view showing a sectional view showing another semiconductor device according to the eighth embodiment of the present invention.

In FIG. 33, the heterodiode formed at the center of the hetero-semiconductor element is made of the first polysilicon region 59 containing a high concentration of p-type impurities like the peripheral part thereof. Instead, a second polysilicon region 62 of an n-type may be formed as shown in FIG. 34. Namely, the second polysilicon region 62 has a different conductivity type or a different impurity concentration from the first polysilicon region 59.

As explained above, any one of the sixth to eighth embodiments provides a semiconductor device having an epitaxial region 2 and a first polysilicon region 73 (59) having a different band gap from the epitaxial region 2. The regions 2 and 73 (59) form a heterojunction. In contact with an end of a junction face between the epitaxial region 2 and the first polysilicon region 73 (59), there are formed in the epitaxial region 2 a punch-through preventive region 34 (50) of a second conductivity type and an electric field relaxation region 35 (61) of the second conductivity type. At least the punch-through preventive region 34 (50) has an impurity concentration equal to or larger than that of the electric field relaxation region 35 (61). This configuration improves the withstand voltage of the epitaxial region 2, and at the same time, prevents a leakage current to be generated at the edge of the first polysilicon region 73 (59). Also improved is a disconnection ability.

At least the circumference of the first polysilicon region 73 (59) in contact with the epitaxial region 2 is of the second conductivity type. If an avalanche breakdown occurs in the epitaxial region 2, minority carriers generated by the avalanche breakdown are quickly discharged through the punch-through preventive region 34 (50) and first polysilicon region 73 (59). This improves an avalanche resistance.

At least the circumference of the first polysilicon region 73 (59) in contact with the epitaxial region 2 is ohmic-connected to the punch-through preventive region 34 (50). If an avalanche breakdown occurs in the epitaxial region 2, minority carriers generated by the avalanche breakdown are more quickly discharged through the punch-through preventive region 34 (50) and first polysilicon region 73 (59). This further improves an avalanche resistance.

A second polysilicon region 40 (FIG. 29) may be formed on a principal face of the semiconductor base 100 that includes the epitaxial region 2. The second polysilicon region 40 has a different band gap from the semiconductor base 100. At least in the vicinity of the periphery of a junction between the semiconductor base 100 and the second polysilicon region 40, there are formed the first polysilicon region 73, punch-through preventive region 34, and electric field relaxation region 35. In this way, the characteristic structure of the present invention is applicable to the hetero-semiconductor element, to achieve the effects of the present invention.

According to any one of the seventh and eighth embodiments, a part of the junction between the first polysilicon region 73 (59, or the second polysilicon region 40 of FIG.

29) and the semiconductor base 100 is provided with the gate insulating film 41 (55) and gate electrode 42 (56). For a peripheral part of this three-terminal hetero-semiconductor element, the characteristic structure of the present invention is applied to achieve the effects of the present invention.

According to the eighth embodiment, the semiconductor base 100 includes the epitaxial region 2, base region 53 of the second conductivity type, and source region 54 of the first conductivity type. In contact with at least the semiconductor base 100 and source region 54, the gate insulating film 55 and gate electrode 56 are formed. At least in the vicinity of the periphery of a junction between the semiconductor base 100 and the first polysilicon region 59, the punch-through preventive region 50 and electric field relaxation region 61 are formed. In this way, the characteristic structure of the present invention is employable as a built-in diode of a three-terminal semiconductor element, to achieve the effects of the present invention.

According to the eighth embodiment, the semiconductor base 100 includes the epitaxial region 2. A predetermined region of the semiconductor base 100 includes the base region 53 of the second conductivity type and the source region 54 of the first conductivity type. At least in contact with the semiconductor base 100 and source region 54, the gate insulating film 55 and gate electrode 26 are formed. In contact with the semiconductor base 100, there is the second polysilicon region 62 having a different band gap from the semiconductor base 100. At least in the vicinity of the periphery of a junction between the semiconductor base 100 and the second polysilicon region 62, there are the first polysilicon region 59, punch-through preventive region 50, and electric field relaxation region 61. In this way, the characteristic structure of the present invention is employable as a built-in diode of a three-terminal semiconductor element, to achieve the effects of the present invention.

According to the semiconductor device of any one of the sixth to eighth embodiments, the epitaxial region 2 is made of silicon carbide. Accordingly, the semiconductor device is easily realized with standard materials. The first polysilicon region 73 (59) and second polysilicon region 40 are made of at least one of monocrystalline silicon, amorphous silicon, and polysilicon. Namely, the semiconductor device is easily realized with standard materials through standard manufacturing processes. The epitaxial region 2 corresponds to a first semiconductor region, the first polysilicon region 73 (59) to a second semiconductor region, and the second polysilicon region 40 to a polysilicon region.

According to any one of the sixth to eighth embodiments, the semiconductor device employs silicon carbide as a substrate material. The substrate material may be silicon, silicon germane (germanium), gallium nitride, diamond, or any other semiconductor material. According to any one of the embodiments, the polytype of silicon carbide is 4H. Instead, a polytype of 6H, 3C, or any other is employable. According to any one of the embodiments, the bottom metal electrode 6 and surface metal electrode 38 (or source electrode 57) are arranged to face each other with the epitaxial region 2 interposed between them, to form a vertical structure in which a current vertically flows between the electrodes. It is also possible to arrange the bottom metal electrode 6 and surface metal electrode 38 (or source electrode 57) on the same principal face to form a horizontal structure in which a current flows horizontally. Any one of the embodiments forms the first polysilicon region 73 (59) and second polysilicon region 40 from polycrystalline silicon. The regions 73 (59) and 40 may both or individually employ any other semiconductor material (for example, monocrystalline silicon, germanium, and silicon germane (germanium)) if the semiconductor material can form a heterojunction with silicon carbide. Each embodiment forms the epitaxial region 2 from n-type silicon carbide and the first polysilicon region 73 (59) from p-type polysilicon. It is also possible to employ a combination of n-type silicon carbide and n-type polysilicon, or p-type silicon carbide and n-type polysilicon, or p-type silicon carbide and p-type polysilicon.

The semiconductor device according to any one of the embodiments demonstrates an improved withstand voltage in the first semiconductor region and a leakage current preventive ability at the periphery of the second semiconductor region that forms a heterojunction with the first semiconductor region.

The entire contents of Japanese Patent Applications No. 2003-282476 filed on Jul. 30$^{th}$, 2003, No. 2004-65972 filed on Mar. 9$^{th}$, 2004, and No. 2004-117549 filed on Apr. 13$^{th}$, 2004 are hereby incorporated by reference.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor device comprising:
    a first semiconductor region of a first conductivity type; and
    a second semiconductor region of a second conductivity type, having a different band gap from the first semiconductor region and forming a heterojunction with the first semiconductor region,
    wherein the second semiconductor region includes a non-depletion area that is not depleted when a reverse bias is applied to the heterodiode,
    wherein the thickness of the non-depletion area that is not depleted when a reverse bias is applied to the heterodiode is greater than a diffusion length in the non-depletion area of carriers that act as majority carriers in the first semiconductor region.

2. The semiconductor device of claim 1 wherein:
    the non-depletion area has an impurity concentration equal to or greater than an impurity concentration of the first semiconductor region.

3. The semiconductor device of claim 1, wherein:
    a principal ingredient of the first semiconductor region is silicon carbide.

4. The semiconductor device of claim 1, wherein:
    the second semiconductor region is made of a material selected from the group consisting of monocrystalline silicon, amorphous silicon, and polysilicon.

5. The semiconductor device of claim 1, further comprising:
    a semiconductor base including the first semiconductor region;
    an anode electrode formed in contact with a first principal face of the semiconductor base;
    a cathode electrode in contact with an opposite face of the semiconductor base, the opposite face opposing the first principal face; and
    at least one electric field relaxation region containing impurities, formed in the first semiconductor region in contact with the heterojunction.

6. The semiconductor device of claim 5, wherein:
the electric field relaxation region is arranged in an annular shape around the anode electrode.

7. The semiconductor device of claim 5, wherein:
a plurality of the electric field relaxation regions are arranged at predetermined intervals.

8. The semiconductor device of claim 1, further comprising:
an active region including:
a drain region formed in a semiconductor base that includes the first semiconductor region;
a source region formed in the second semiconductor region that has a different band gap from the first semiconductor region; and
a drive region;
a gate electrode;
a gate insulating film to insulate the gate electrode from the semiconductor base and source region;
a drain electrode formed in contact with the drain region;
a source electrode formed in contact with the source region; and
at least one electric field relaxation region with impurities introduced therein, formed in the first semiconductor region in contact with the heterojunction.

9. The semiconductor device of claim 8, wherein:
at least one electric field relaxation region is arranged inside of the active region.

10. The semiconductor device of claim 8, further comprising:
a trench formed on a first principal face of the semiconductor base.

11. A semiconductor device comprising:
a first semiconductor region of a first conductivity type; and
a second semiconductor region of a second conductivity type, having a different band gap from the first semiconductor region and forming a heterojunction with the first semiconductor region,
wherein the second semiconductor region includes a non-depletion area that is not depleted when a reverse bias is applied to the heterodiode,
wherein the non-depletion area has an impurity concentration that is higher than an impurity concentration of the first semiconductor region by a critical-field-strength ratio of the first semiconductor region to the second semiconductor region.

12. A semiconductor device comprising:
a first semiconductor region of a first conductivity type;
a second semiconductor region of a second conductivity type, having a different band gap from the first semiconductor region and forming a heterojunction with the first semiconductor region;
a semiconductor base including the first semiconductor region;
a hetero-semiconductor region that is in contact with a principal face of the semiconductor base and has a different band gap from the semiconductor base, at least part of the hetero-semiconductor region being the second semiconductor region;
a gate insulating film formed in contact with a part of a junction between the hetero-semiconductor region and the semiconductor base; and
a gate electrode insulated by the gate insulating film from the hetero-semiconductor region and the semiconductor base.

13. The semiconductor device of claim 12, further comprising:
a base region of the second conductivity type formed in the semiconductor base; and
a source region of the first conductivity type formed in the semiconductor base.

14. A semiconductor device comprising:
a first semiconductor region of a first conductivity type;
a second semiconductor region of a second conductivity type, having a different band gap from the first semiconductor region and forming a heterojunction with the first semiconductor region;
an electric field relaxation region of the second conductivity type with impurities introduced therein, formed in the first semiconductor region in contact with the heterojunction; and
a punch-through preventive region of the second conductivity type formed in the first semiconductor region in contact with a junction face between the first semiconductor region and the second semiconductor region, an impurity concentration of the punch-through preventive region being equal to or greater than an impurity concentration of the electric field relaxation region.

15. The semiconductor device of claim 14, wherein:
an end of the second semiconductor region in contact with the first semiconductor region is of the second conductivity type.

16. The semiconductor device of claim 14, wherein:
an end of the second semiconductor region in contact with the first semiconductor region is ohmic-connected to the punch-through preventive region.

17. The semiconductor device of claim 14, wherein:
the second semiconductor region, punch-through preventive region, and electric field relaxation region are formed in the vicinity of an outermost periphery of a junction between the heterojunction and a semiconductor base that includes the first semiconductor region.

18. The semiconductor device of claim 14, further comprising:
a gate insulating film and a gate electrode formed at a part of a junction between the second semiconductor region or hetero-semiconductor region and a semiconductor base that includes the first semiconductor region.

19. The semiconductor device of claim 14, further comprising:
a semiconductor base including the first semiconductor region;
a base region of the second conductivity type formed in a predetermined area of the semiconductor base;
a source region of the first conductivity type formed in a predetermined area of the semiconductor base;
a gate insulating film formed in contact with a part of a junction between the hetero-semiconductor region and the semiconductor base;
a gate electrode insulated by the gate insulating film from the hetero-semiconductor region and the semiconductor base; and
a gate electrode and a gate insulating film formed in contact with the semiconductor base and source region,
wherein the electric field relaxation region and punch-through preventive region is formed in the vicinity of an outermost periphery of a junction between the semiconductor base and the second semiconductor region.

20. A method of manufacturing a semiconductor device, comprising:
- forming a first semiconductor region from a first semiconductor material;
- forming a second semiconductor region on a surface of the first semiconductor region from a second semiconductor material whose band gap is different from that of the first semiconductor material, thereby forming a heterojunction between the first semiconductor region and the second semiconductor region; and
- introducing impurities into a surface of the first semiconductor region over the second semiconductor region, to form an electric field relaxation region in the first semiconductor region that forms the heterojunction with the second semiconductor region.

21. The method of claim 20, wherein:
the introducing impurities into a surface of the second semiconductor region is conducted by ion implantation.

22. The method of claim 20, wherein:
the second semiconductor region is partly or wholly formed to be thinner than a flying distance of the impurities to be introduced.

* * * * *